United States Patent
Kondo

(10) Patent No.: US 9,059,056 B2
(45) Date of Patent: Jun. 16, 2015

(54) SOLID-STATE IMAGING DEVICE AND IMAGING DEVICE

(71) Applicant: OLYMPUS CORPORATION, Tokyo (JP)

(72) Inventor: Toru Kondo, Tokyo (JP)

(73) Assignee: OLYMPUS CORPORATION, Tokyo (JP)

( * ) Notice: Subject to any disclaimer, the term of this patent is extended or adjusted under 35 U.S.C. 154(b) by 174 days.

(21) Appl. No.: 13/677,952

(22) Filed: Nov. 15, 2012

(65) Prior Publication Data

US 2013/0126710 A1    May 23, 2013

(30) Foreign Application Priority Data

Nov. 17, 2011    (JP) .................................. 2011-251529

(51) Int. Cl.
| | |
|---|---|
| *H04N 3/14* | (2006.01) |
| *H01L 27/146* | (2006.01) |
| *H04N 5/335* | (2011.01) |
| *H04N 5/369* | (2011.01) |

(52) U.S. Cl.
CPC .... *H01L 27/14609* (2013.01); *H01L 27/14634* (2013.01); *H01L 27/14636* (2013.01); *H04N 5/369* (2013.01)

(58) Field of Classification Search
CPC ..... H04N 5/335; H04N 5/376; H04N 5/3765; H04N 3/1575; H04N 5/2258; H04N 17/002
USPC .............. 348/222.1, 312, 294, 340, 373–376; 438/118
See application file for complete search history.

(56) References Cited

U.S. PATENT DOCUMENTS

| | | | | |
|---|---|---|---|---|
| 6,833,626 | B2* | 12/2004 | Kajiwara et al. ............... | 257/777 |
| 7,030,926 | B2* | 4/2006 | Miyake et al. ................. | 348/340 |
| 7,405,764 | B2* | 7/2008 | Gustavsson et al. .......... | 348/374 |
| 2003/0148558 | A1* | 8/2003 | Kubo et al. .................... | 438/128 |
| 2006/0023109 | A1* | 2/2006 | Mabuchi et al. ............... | 348/340 |
| 2007/0069258 | A1* | 3/2007 | Ahn .............................. | 257/290 |
| 2008/0284888 | A1* | 11/2008 | Kobayashi ..................... | 348/308 |
| 2009/0230287 | A1* | 9/2009 | Anderson et al. ........... | 250/208.1 |
| 2013/0048832 | A1* | 2/2013 | Peizerat et al. ............ | 250/208.1 |
| 2013/0119233 | A1* | 5/2013 | Guezzi et al. .............. | 250/208.1 |

FOREIGN PATENT DOCUMENTS

JP    2010-219339 A    9/2010

* cited by examiner

*Primary Examiner* — Hung Lam
(74) *Attorney, Agent, or Firm* — Westerman, Hattori, Daniels & Adrian, LLP

(57) ABSTRACT

A solid-state imaging device and an imaging device are capable of transferring a control signal to pixels formed in each chip of the solid-state imaging device, in which the plurality of chips are connected to each other, without an increase in a circuit size of the solid-state imaging device or an increase in the number of connectors between the chips. The solid-state imaging device, in which first and second substrates are electrically connected to each other via the connectors, includes a pixel unit in which a plurality of pixels each including a photoelectric conversion element disposed in the first substrate and a reading circuit disposed in the second substrate are arrayed two-dimensionally, and a read control circuit that controls reading of a signal from the pixels. The read control circuit includes a pulse generation unit and a logical unit.

26 Claims, 10 Drawing Sheets

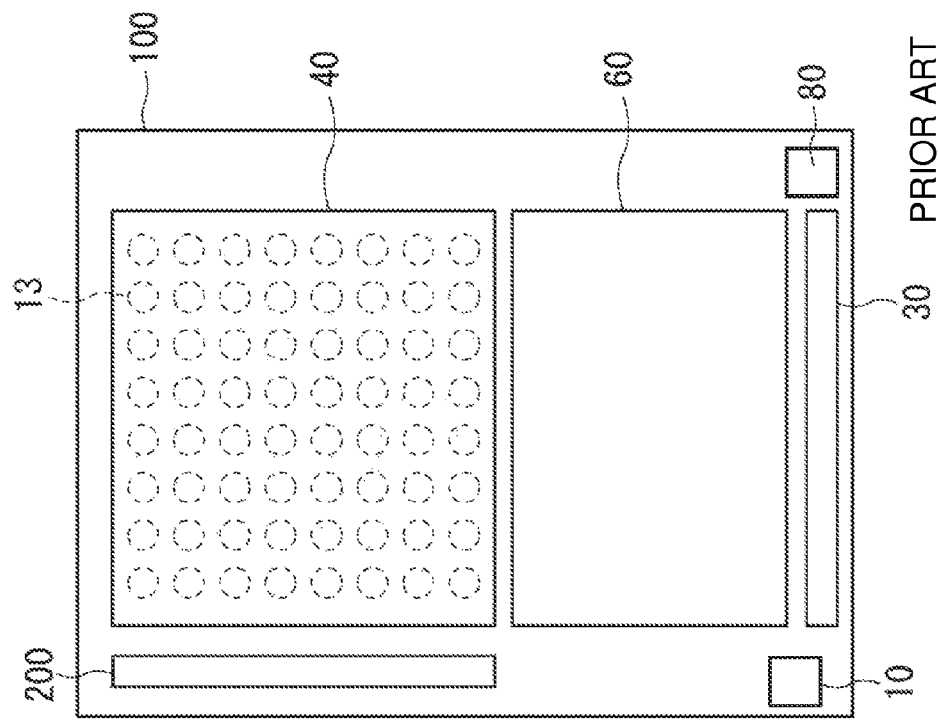
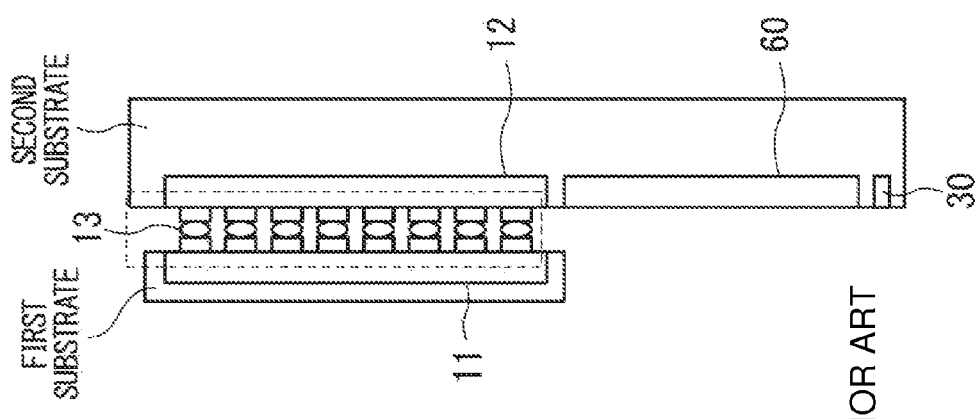
FIG. 10A PRIOR ART
FIG. 10B PRIOR ART

SOLID-STATE IMAGING DEVICE AND IMAGING DEVICE

BACKGROUND OF THE INVENTION

1. Field of the Invention

The present invention relates to a solid-state imaging device and an imaging device.

Priority is claimed on Japanese Patent Application No. 2011-251529, filed Nov. 17, 2011, the content of which is incorporated herein by reference.

2. Description of Related Art

In recent years, imaging devices such as video cameras and electronic still cameras have generally come into wide use. Charge coupled device (CCD)-type or amplification-type solid-state imaging devices have been used in such imaging devices (hereinafter referred to as "cameras"). In the amplification-type solid-state imaging devices, a plurality of pixels are arrayed in a two-dimensional matrix form. In the amplification-type solid-state imaging devices, signal charges generated and stored by photoelectric conversion elements serving as light-receiving units of pixels are guided toward amplification units installed in the pixels, and the signals amplified by the amplification units are output as output signals from the pixels.

Examples of the amplification-type solid-state imaging device include a solid-state imaging device in which a junction field effect transistor is used in an amplification unit and a complementary metal oxide semiconductor (CMOS)-type solid-state imaging device in which a CMOS transistor is used in an amplification unit.

In the past, a general CMOS type solid-state imaging device (hereinafter, also referred to as a "solid-state imaging device") has utilized a method of sequentially reading signal charges generated and stored by photoelectric conversion elements of pixels arrayed in a two-dimensional matrix form for each row. According to this reading method, an exposure timing in the photoelectric conversion element of each pixel is determined by start and end of the reading of the signal charge. Therefore, the exposure timing is different for each pixel. Therefore, when a fast-moving subject is imaged using such a CMOS type solid-state imaging device, the subject in the captured image may be distorted.

As an exposure method of eliminating the distortion of the subject, a simultaneous imaging function (hereinafter referred to as a "global shutter function") of generating and storing signal charges to realize simultaneity of the generation and storage of the signal charges by exposing all of the pixels at the same timing has been suggested. CMOS type solid-state imaging devices having the global shutter function tend to be used for many purposes.

In the CMOS type solid-state imaging devices having the global shutter function, it is generally necessary to store the signal charges generated by the photoelectric conversion elements until reading ends. Therefore, a storage capacitor having a light-shielding property is necessary. In the CMOS type solid-state imaging devices having the global shutter function according to the related art, after simultaneous exposure of all of the pixels, the signal charges generated by the photoelectric conversion elements are simultaneously transmitted to the storage capacitors in all of the pixels and are stored once, and then the signal charges stored in the storage capacitors are sequentially converted into pixel signals at a predetermined reading timing.

In the technology disclosed in Japanese Unexamined Patent Application, First Publication No. 2010-219339, pixels having the global shutter function according to the related art are distributed between two substrates. Therefore, it is possible to prevent the chip area of a first substrate from increasing. Further, as the first and second substrates are configured to be bonded to each other, it is possible to prevent a signal quality from deteriorating due to noise caused by light during a waiting period until the signal charges stored in the storage capacitors are read.

FIGS. 10A and 10B are diagrams illustrating the overview of a connection configuration of substrates of a solid-state imaging device of the related art to which the technology disclosed in Japanese Unexamined Patent Application, First Publication No. 2010-219339 is applied. FIG. 10A is a side view illustrating the connection configuration of the first and second substrates of a solid-state imaging device 100. FIG. 10B is a top view illustrating the connection configuration of the first and second substrates of the solid-state imaging device 100.

In the solid-state imaging device 100, as shown in FIG. 10A, a pixel unit 11 formed in the first substrate and a pixel unit 12 formed in the second substrate are connected to each other via inter-substrate connectors 13. More specifically, photoelectric conversion elements are formed in the pixel unit 11 and the storage capacitors are formed in the pixel unit 12. In the inter-substrate connector 13, for example, the photoelectric conversion element in the pixel unit 11 and the storage capacitor in the pixel unit 12 are connected to each other via a bump. Thus, in the solid-state imaging device 100, the pixel units 11 and 12 connected to each other via the bumps are configured to form a lamination structure in the region of a pixel array unit 40 of the solid-state imaging device 100.

However, in order to read the pixel signals from the pixels arrayed in the solid-state imaging device, it is necessary to transmit a plurality of control signals to each of the pixels. Therefore, in the solid-state imaging device 100 shown in FIGS. 10A and 10B, it is necessary for a vertical reading circuit 200 to transmit the plurality of control signals to each of the pixels of the pixel unit 11 formed in the first substrate and the pixel unit 12 formed in the second substrate.

SUMMARY OF THE INVENTION

According to a first aspect of the present invention, there is provided a solid-state imaging device in which first and second substrates are electrically connected to each other via connector. The solid-state imaging device includes: a pixel unit in which a plurality of pixels are arrayed two-dimensionally, each pixel including a photoelectric conversion element that is disposed in the first substrate and generates a signal according to an amount of incident light and a reading circuit that is disposed in the second substrate to correspond to the photoelectric conversion element and reads the signal generated by the corresponding photoelectric conversion element, and a read control circuit that controls the reading of the signal from the pixel. The read control circuit includes a pulse generation unit that generates a control signal for controlling the reading of the signal from the pixel, a selection unit that selects at least a row of the pixels arrayed in the pixel unit of the second substrate based on the control signal, and a logical unit that generates a driving signal for driving each circuit element in the pixels of the selected row based on the control signal and supplies the generated driving signal to each circuit element of each of the pixels arrayed in the pixel unit. Among constituent elements included in the read control circuit, some of the constituent elements are disposed in the first substrate and remaining constituent elements of the read control circuit are disposed in the second substrate, and the constituent elements of the read control circuit disposed in the first substrate are electrically connected to the constituent elements of the read control circuit disposed in the second substrate via the connector.

According to a second aspect of the present invention, in the solid-state imaging device of the first aspect, the pulse generation unit may generate a control signal for sequentially reading the signals from the pixels for each row. The selection unit may sequentially select the pixels disposed in the pixel unit of the first substrate and the pixel unit of the second substrate for each row. The logical unit may generate the driving signal for driving each circuit element of the pixels of the sequentially selected rows for each row and supply the generated driving signal to each circuit element of each of the pixels arrayed in the pixel unit of the first substrate and the pixel unit of the second substrate.

According to a third aspect of the present invention, in the solid-state imaging device of the second aspect, the logical unit may include a first logical unit that includes a driving circuit driving each circuit element of each of the pixels arrayed in the pixel unit of the first substrate, and a second logical unit that includes a driving circuit driving each circuit element of each of the pixels arrayed in the pixel unit of the second substrate. The first logical unit may be disposed in the first substrate and the second logical unit may be disposed in the second substrate.

According to a fourth aspect of the present invention, in the solid-state imaging device of the third aspect, the selection unit may be disposed in the second substrate. The first logical unit and the selection unit may be electrically connected to each other via the connector.

According to a fifth aspect of the present invention, in the solid-state imaging device of the fourth aspect, the selection unit may generate a selecting signal for selecting a row of the pixels arrayed in the pixel unit of the first substrate and supply the generated selecting signal to the first logical unit via the connector.

According to a sixth aspect of the present invention, in the solid-state imaging device of the fifth aspect, the first logical unit may include a plurality of the driving circuits respectively corresponding to the circuit elements of the pixels arrayed in the pixel unit of the first substrate. The selection unit may generate a plurality of selecting signals respectively corresponding to the rows of the pixels arrayed in the pixel unit of the first substrate and supply each generated selecting signal to each driving circuit in the first logical unit via each connector disposed to correspond to each row of the pixels arrayed in the pixel unit of the first substrate.

According to a seventh aspect of the present invention, in the solid-state imaging device of the third aspect, the pulse generation unit may be disposed in the second substrate. The first logical unit and the pulse generation unit may be electrically connected to each other via the connector.

According to an eighth aspect of the present invention, in the solid-state imaging device of the seventh aspect, the pulse generation unit may generate a pulse signal which is a control signal for controlling each circuit element of the pixels arrayed in the pixel unit of the first substrate and supply the generated pulse signal to the first logical unit via the connector.

According to a ninth aspect of the present invention, in the solid-state imaging device of the eighth aspect, the first logical unit may include a plurality of driving circuits respectively corresponding to the circuit elements of the pixels arrayed in the pixel unit of the first substrate. The pulse generation unit may supply the pulse signal for controlling each circuit element of the pixels arrayed in the pixel unit of the first substrate to each driving circuit in the first logical unit via each connector disposed to correspond to each circuit element of the pixels arrayed in the pixel unit of the first substrate.

According to a tenth aspect of the present invention, in the solid-state imaging device of the second aspect, the pulse generation unit may be disposed in the second substrate. The constituent elements of the read control circuit disposed in the first substrate and the pulse generation unit may be electrically connected to each other via the connectors.

According to an eleventh aspect of the present invention, in the solid-state imaging device of the second aspect, the selection unit may be disposed in the second substrate. The constituent elements of the read control circuit disposed in the first substrate and the selection unit may be electrically connected to each other via the connectors.

According to a twelfth aspect of the present invention, in the solid-state imaging device of the third aspect, the pixels arrayed in the pixel unit of the first substrate may each further include a photoelectric conversion element reset unit that resets the signal generated by the photoelectric conversion element, and a first transfer unit that transfers the signal generated by the photoelectric conversion element to the pixel unit of the second substrate via the connector. The pulse generation unit may generate each control signal for controlling the photoelectric conversion element reset unit and the first transfer unit and supply each generated control signal to the first logical unit. The first logical unit may generate each driving signal for driving the photoelectric conversion element reset unit and the first transfer unit based on each control signal, and supply the generated driving signals to the photoelectric conversion element reset unit and the first transfer unit, respectively.

According to a thirteenth aspect of the present invention, in the solid-state imaging device of the twelfth aspect, the pixels arrayed in the pixel unit of the second substrate may each further include a storage unit that stores the signal generated by the photoelectric conversion element and transferred via the connector, an amplification unit that amplifies the signal generated by the photoelectric conversion element, a second transfer unit that transfers the signal stored in the storage unit to the amplification unit, a reset unit that resets the signal transferred by the second transfer unit, and an output unit that outputs the amplified signal amplified by the amplification unit as an output signal read from the pixel. The pulse generation unit may generate each control signal for controlling the second transfer unit, the reset unit, and the output unit and supplies each generated control signal to the second logical unit. The second logical unit may generate each driving signal for driving the second transfer unit, the reset unit, and the output unit based on each control signal and supply the generated driving signals to the second transfer unit, the reset unit, and the output unit, respectively.

According to a fourteenth aspect of the present invention, in the solid-state imaging device of the third aspect, the pixels arrayed in the pixel unit of the first substrate may each further include an amplification unit that amplifies the signal generated by the photoelectric conversion element and outputs the amplified signal to the pixel unit of the second substrate via the connector, a first transfer unit that transfers the signal generated by the photoelectric conversion element to the amplification unit, and a reset unit that resets the signal transferred by the first transfer unit. The pulse generation unit may generate each control signal for controlling the first transfer unit and the reset unit and supply each generated control signal to the first logical unit. The first logical unit may generate each driving signal for driving the first transfer unit and the reset unit based on each control signal and supply the generated driving signals to the first transfer unit and the reset unit, respectively.

According to a fifteenth aspect of the present invention, in the solid-state imaging device of the fourteenth aspect, the pixels arrayed in the pixel unit of the second substrate may each further include a load unit which serves as load of the amplification unit, a sample holding unit that samples and holds the amplified signal input via the connector, a storage unit that stores the signal sampled and held by the sample holding unit, a clamp unit that clamps the sampled and held signal stored by the storage unit to a fixed potential, and an output unit that outputs the sampled and held signal stored by the storage unit as an output signal read from the pixel. The pulse generation unit may generate each control signal for controlling the load unit, the sample holding unit, the clamp unit, and the output unit and supply each generated control signal to the second logical unit. The second logical unit may generate each driving signal for driving the load unit, the sample holding unit, the clamp unit, and the output unit based on each control signal and supply the generated driving signals to the load unit, the sample holding unit, the clamp unit, and the output unit, respectively.

According to a sixteenth aspect of the present invention, in the solid-state imaging device of the second aspect, the pulse generation unit may generate a control signal for sequentially selecting the pixels for each row, causing the photoelectric conversion elements of the pixels arrayed in the pixel unit of the first substrate to sequentially generate the signals according to the amount of incident light, and causing the reading circuit of the pixels arrayed in the pixel unit of the second substrate to sequentially read the signals generated by the corresponding photoelectric conversion elements, and supply the generated control signal to the selection unit and the logical unit.

According to a seventeenth aspect of the present invention, in the solid-state imaging device of the second aspect, the pulse generation unit may generate a control signal for simultaneously selecting the pixels, causing the photoelectric conversion elements of the pixels arrayed in the pixel unit of the first substrate to simultaneously generate the signals according to the amount of incident light, sequentially selecting the pixels for each row, and causing the reading circuit of the pixels arrayed in the pixel unit of the second substrate to sequentially read the signals generated by the corresponding photoelectric conversion elements, and supply the generated control signal to the selection unit and the logical unit.

According to an eighteenth aspect of the present invention, in the solid-state imaging device of the first aspect, the pulse generation unit may generate a control signal for simultaneously reading the signals from all of the pixels arrayed in the pixel unit of the first substrate. The selection unit may sequentially select the pixels arrayed in the pixel unit of the second substrate for each row. The logical unit may generate a driving signal for simultaneously driving the circuit elements of all the pixels arrayed in the pixel unit of the first substrate and a driving signal for driving the circuit elements of the pixels of the sequentially selected rows for each row and supply the generated driving signals to each circuit element of each of the pixels arrayed in the pixel unit of the first substrate and the pixel unit of the second substrate.

According to a nineteenth aspect of the present invention, in the solid-state imaging device of the eighteenth aspect, the logical unit may include a first logical unit that includes a driving circuit driving each circuit element of each of the pixels arrayed in the pixel unit of the first substrate, and a second logical unit that includes a driving circuit driving each circuit element of each of the pixels arrayed in the pixel unit of the second substrate. The first logical unit may be disposed in the first substrate and the second logical unit may be disposed in the second substrate.

According to a twentieth aspect of the present invention, in the solid-state imaging device of the nineteenth aspect, the selection unit may be disposed in the second substrate. The first logical unit and the selection unit may be electrically connected to each other via the connector.

According to a twenty first aspect of the present invention, in the solid-state imaging device of the twentieth aspect, the selection unit may generate a selecting signal for selecting a row of the pixels arrayed in the pixel unit of the first substrate and supply the generated selecting signal to the first logical unit via the connector.

According to a twenty second aspect of the present invention, in the solid-state imaging device of the twenty first aspect, the first logical unit may include a plurality of the driving circuits respectively corresponding to the circuit elements of the pixels arrayed in the pixel unit of the first substrate. The selection unit may generate a plurality of selecting signals respectively corresponding to the rows of the pixels arrayed in the pixel unit of the first substrate and supply each generated selecting signal to each driving circuit in the first logical unit via each connector disposed to correspond to each row of the pixels arrayed in the pixel unit of the first substrate.

According to a twenty third aspect of the present invention, in the solid-state imaging device of the nineteenth aspect, the pulse generation unit may be disposed in the second substrate. The first logical unit and the pulse generation unit may be electrically connected to each other via the connector.

According to a twenty fourth aspect of the present invention, in the solid-state imaging device of the twenty third aspect, the pulse generation unit may generate a pulse signal which is a control signal for controlling each circuit element of the pixels arrayed in the pixel unit of the first substrate and supply the generated pulse signal to the first logical unit via the connector.

According to a twenty fifth aspect of the present invention, in the solid-state imaging device of the twenty fourth aspect, the first logical unit may include a plurality of driving circuits respectively corresponding to the circuit elements of the pixels arrayed in the pixel unit of the first substrate. The pulse generation unit may supply the pulse signal for controlling each circuit element of the pixels arrayed in the pixel unit of the first substrate to each driving circuit in the first logical unit via each connector disposed to correspond to each circuit element of the pixels arrayed in the pixel unit of the first substrate.

According to a twenty sixth aspect of the present invention, in the solid-state imaging device of the eighteenth aspect, the pulse generation unit may be disposed in the second substrate. The constituent elements of the read control circuit disposed in the first substrate and the pulse generation unit may be electrically connected to each other via the connectors.

According to a twenty seventh aspect of the present invention, in the solid-state imaging device of the eighteenth aspect, the selection unit may be disposed in the second substrate. The constituent elements of the read control circuit disposed in the first substrate and the selection unit may be electrically connected to each other via the connectors.

According to a twenty eighth aspect of the present invention, in the solid-state imaging device of the nineteenth aspect, the pixels arrayed in the pixel unit of the first substrate may each further include a photoelectric conversion element reset unit that resets the signal generated by the photoelectric conversion element, and a first transfer unit that transfers the signal generated by the photoelectric conversion element to the pixel unit of the second substrate via the connector. The pulse generation unit may generate each control signal for controlling the photoelectric conversion element reset unit and the first transfer unit and supplies each generated control signal to the first logical unit. The first logical unit may generate each driving signal for driving the photoelectric conversion element reset unit and the first transfer unit based on each control signal, and supply the generated driving signals to the photoelectric conversion element reset unit and the first transfer unit, respectively.

According to a twenty ninth aspect of the present invention, in the solid-state imaging device of the twenty eighth aspect, the pixels arrayed in the pixel unit of the second substrate may each further include a storage unit that stores the signal generated by the photoelectric conversion element and transferred via the connector, an amplification unit that amplifies the signal generated by the photoelectric conversion element, a second transfer unit that transfers the signal stored in the storage unit to the amplification unit, a reset unit that resets the signal transferred by the second transfer unit, and an output unit that outputs the amplified signal amplified by the amplification unit as an output signal read from the pixel. The pulse generation unit may generate each control signal for controlling the second transfer unit, the reset unit, and the output unit and supply each generated control signal to the second logical unit. The second logical unit may generate each driving signal for driving the second transfer unit, the reset unit, and the output unit based on each control signal and supply the generated driving signals to the second transfer unit, the reset unit, and the output unit, respectively.

According to a thirtieth aspect of the present invention, in the solid-state imaging device of the nineteenth aspect, the pixels arrayed in the pixel unit of the first substrate may each further include an amplification unit that amplifies the signal generated by the photoelectric conversion element and outputs the amplified signal to the pixel unit of the second substrate via the connector, a first transfer unit that transfers the signal generated by the photoelectric conversion element to the amplification unit, and a reset unit that resets the signal transferred by the first transfer unit. The pulse generation unit may generate each control signal for controlling the first transfer unit and the reset unit and supplies each generated control signal to the first logical unit. The first logical unit may generate each driving signal for driving the first transfer unit and the reset unit based on each control signal and supply the generated driving signals to the first transfer unit and the reset unit, respectively.

According to a thirty first aspect of the present invention, in the solid-state imaging device of the thirtieth aspect, the pixels arrayed in the pixel unit of the second substrate may each further include a load unit which serves as load of the amplification unit, a sample holding unit that samples and holds the amplified signal input via the connector, a storage unit that stores the signal sampled and held by the sample holding unit, a clamp unit that clamps the sampled and held signal stored by the storage unit to a fixed potential, and an output unit that outputs the sampled and held signal stored by the storage unit as an output signal read from the pixel. The pulse generation unit may generate each control signal for controlling the load unit, the sample holding unit, the clamp unit, and the output unit and supply each generated control signal to the second logical unit. The second logical unit may generate each driving signal for driving the load unit, the sample holding unit, the clamp unit, and the output unit based on each control signal and supply the generated driving signals to the load unit, the sample holding unit, the clamp unit, and the output unit, respectively.

According to a thirty second aspect of the present invention, in the solid-state imaging device of the eighteenth aspect, the pulse generation unit may generate a control signal for simultaneously selecting the pixels, causing the photoelectric conversion elements of the pixels arrayed in the pixel unit of the first substrate to simultaneously generate the signals according to the amount of incident light, sequentially selecting the pixels for each row, and causing the reading circuit of the pixels arrayed in the pixel unit of the second substrate to sequentially read the signals generated by the corresponding photoelectric conversion elements, and supply the generated control signal to the selection unit and the logical unit.

According to a thirty third aspect of the present invention, in the solid-state imaging device of the first aspect, the pixel may further include a storage unit that stores the signal generated by the photoelectric conversion element, and an amplification unit that amplifies the signal generated by the photoelectric conversion element. The photoelectric conversion elements of all the pixels may be simultaneously reset. After a predetermined time passes, the signals generated by the photoelectric conversion elements may be simultaneously amplified by the amplification units of all the pixels. The amplified signals may be simultaneously stored in the storage units of all the pixels. The amplified signals stored in the storage units may be output as output signals sequentially read by the reading circuits.

According to a thirty fourth aspect of the present invention, in the solid-state imaging device of the first aspect, a connection point of the connector on a side of the first substrate and a connection point of the connector on a side of the second substrate may be disposed at one position on a path from an output terminal of the photoelectric conversion element to an input terminal of the reading circuit.

According to a thirty fifth aspect of the present invention, in the solid-state imaging device of the first aspect, the connector may be a bump.

According to a thirty sixth aspect of the present invention, in the solid-state imaging device of the first aspect, the connector may include a first electrode formed on a surface of the first substrate and a second electrode formed on a surface of the second substrate and bonded to the first electrode.

According to a thirty seventh aspect of the present invention, in the solid-state imaging device of the first aspect, the second substrate may be connected to an opposite surface to the surface of the first substrate to which the light incident on the photoelectric conversion elements is radiated.

According to a thirty eighth aspect of the present invention, there is provided an imaging device including a solid-state imaging device in which first and second substrates are electrically connected to each other via connectors and which includes a pixel unit, in which a plurality of pixels are arrayed two-dimensionally, each pixel including a photoelectric conversion element that is disposed in the first substrate and generates a signal according to an amount of incident light and a reading circuit that is disposed in the second substrate to correspond to the photoelectric conversion element and reads the signal generated by the corresponding photoelectric conversion element, and a read control circuit that controls the reading of the signal from the pixel. The read control circuit includes a pulse generation unit that generates a control signal for controlling the reading of the signal from the pixel, a selection unit that selects at least a row of the pixels arrayed in the pixel unit of the second substrate based on the control signal, and a logical unit that generates a driving signal for driving each circuit element in the pixels of the selected row based on the control signal and supplies the generated driving signal to each circuit element of each of the pixels arrayed in the pixel unit. Among constituent elements included in the read control circuit, some of the constituent elements are disposed in the first substrate and remaining constituent elements of the read control circuit are disposed in the second substrate, and the constituent elements of the read control circuit disposed in the first substrate are electrically connected to the constituent elements of the read control circuit disposed in the second substrate via the connectors.

According to a thirty ninth aspect of the present invention, there is provided a solid-state imaging device in which first and second substrates are electrically connected to each other via connectors. The device includes: a pixel unit in which a plurality of pixels are arrayed two-dimensionally, each pixel including a photoelectric conversion element that is disposed in the first substrate and generates a signal according to an amount of incident light and a reading transistor which is disposed in the second substrate to correspond to the photoelectric conversion element and of which one of a source and a drain receives the signal generated by the corresponding photoelectric conversion element and the other of the source and the drain outputs the signal generated by the corresponding photoelectric conversion element, and a read control circuit that controls the reading of the signal from the pixel. The read control circuit includes a pulse generation unit that generates a control signal for controlling the reading of the signal from the pixel, a selection unit that selects at least a row of the pixels arrayed in the pixel unit of the second substrate based on the control signal, and a logical unit that generates a driving signal for driving each circuit element in the pixels of the selected row based on the control signal and supplies the generated driving signal to each circuit element of each of the pixels arrayed in the pixel unit. Among constituent elements included in the read control circuit, some of the constituent elements are disposed in the first substrate and remaining constituent elements of the read control circuit are disposed in the second substrate, and the constituent elements of the read control circuit disposed in the first substrate are electrically connected to the constituent elements of the read control circuit disposed in the second substrate via the connectors.

According to a fortieth aspect of the present invention, in the solid-state imaging device of the thirty ninth aspect, the pulse generation unit may generate a control signal for sequentially reading the signals from the pixels for each row. The selection unit may sequentially select the pixels disposed in the pixel unit of the first substrate and the pixel unit of the second substrate for each row. The logical unit may generate the driving signal for driving each circuit element of the pixels of the sequentially selected rows for each row and supply the generated driving signal to each circuit element of each of the pixels arrayed in the pixel unit of the first substrate and the pixel unit of the second substrate.

According to a forty first aspect of the present invention, in the solid-state imaging device of the fortieth aspect, the logical unit may include a first logical unit that includes a driving circuit driving each circuit element of each of the pixels arrayed in the pixel unit of the first substrate, and a second logical unit that includes a driving circuit driving each circuit element of each of the pixels arrayed in the pixel unit of the second substrate. The first logical unit may be disposed in the first substrate and the second logical unit may be disposed in the second substrate.

According to a forty second aspect of the present invention, in the solid-state imaging device of the forty first aspect, the selection unit may be disposed in the second substrate. The first logical unit and the selection unit may be electrically connected to each other via the connector.

According to a forty third aspect of the present invention, in the solid-state imaging device of the forty second aspect, the first logical unit may include a plurality of the driving circuits respectively corresponding to the circuit elements of the pixels arrayed in the pixel unit of the first substrate. The selection unit may generate a plurality of selecting signals respectively corresponding to the rows of the pixels arrayed in the pixel unit of the first substrate and supply each generated selecting signal to each driving circuit in the first logical unit via each connector disposed to correspond to each row of the pixels arrayed in the pixel unit of the first substrate.

According to a forty fourth aspect of the present invention, in the solid-state imaging device of the forty first aspect, the pulse generation unit may be disposed in the second substrate. The first logical unit and the pulse generation unit may be electrically connected to each other via the connector.

According to a forty fifth aspect of the present invention, in the solid-state imaging device of the forty fourth aspect, the first logical unit may include a plurality of driving circuits respectively corresponding to the circuit elements of the pixels arrayed in the pixel unit of the first substrate. The pulse generation unit may supply the pulse signal for controlling each circuit element of the pixels arrayed in the pixel unit of the first substrate to each driving circuit in the first logical unit via each connector disposed to correspond to each circuit element of the pixels arrayed in the pixel unit of the first substrate.

According to a forty sixth aspect of the present invention, in the solid-state imaging device of the fortieth aspect, the pulse generation unit may be disposed in the second substrate. The constituent elements of the read control circuit disposed in the first substrate and the pulse generation unit may be electrically connected to each other via the connectors.

According to a forty seventh aspect of the present invention, in the solid-state imaging device of the fortieth aspect, the selection unit may be disposed in the second substrate. The constituent elements of the read control circuit disposed in the first substrate and the selection unit may be electrically connected to each other via the connectors.

According to a forty eighth aspect of the present invention, in the solid-state imaging device of the forty first aspect, the pixels arrayed in the pixel unit of the first substrate may each further include a photoelectric conversion element reset transistor that resets the signal generated by the photoelectric conversion element, and a first transfer transistor of which one of a source and a drain receives the signal generated by the photoelectric conversion element and of which the other of the source and the drain outputs the signal generated by the photoelectric conversion element to transfer the signal to the pixel unit of the second substrate via the connector. The pulse generation unit may generate each control signal for controlling the photoelectric conversion element reset transistor and the first transfer transistor and supply each generated control signal to the first logical unit. The first logical unit may generate each driving signal for driving the photoelectric conversion element reset transistor and the first transfer transistor based on each control signal, and supply the generated driving signals to gates of the photoelectric conversion element reset transistor and the first transfer transistor, respectively.

According to a forty ninth aspect of the present invention, in the solid-state imaging device of the forty eighth aspect, the pixels arrayed in the pixel unit of the second substrate may each further include an analog memory circuit which is a storage capacitor that stores the signal generated by the photoelectric conversion element and transferred via the connector, an amplification transistor of which a gate receives the signal generated by the photoelectric conversion element and one of a source and a drain outputs the amplified signal, a second transfer transistor of which one of a source and a drain receives the signal stored in the storage capacitor and the other of the source and the drain outputs the signal to transfer the signal to the amplification transistor, a reset transistor that resets the signal transferred by the second transfer transistor, and an output transistor of which one of a source and a drain receives the amplified signal amplified by the amplification transistor and the other of the source and the drain outputs the amplified signal to output the amplified signal as an output signal read from the pixel. The pulse generation unit may generate each control signal for controlling the second transfer transistor, the reset transistor, and the output transistor and supply each generated control signal to the second logical unit. The second logical unit may generate each driving signal for driving the second transfer transistor, the reset transistor, and the output transistor based on each control signal and supply the generated driving signals to gates of the second transfer transistor, the reset transistor, and the output transistor, respectively.

According to a fiftieth aspect of the present invention, in the solid-state imaging device of the forty first aspect, the pixels arrayed in the pixel unit of the first substrate may each further include an amplification transistor of which a gate receives the signal generated by the photoelectric conversion element and one of a source and a drain outputs the amplified signal to the pixel unit of the second substrate via the connector, a first transfer transistor of which one of a source and a drain receives the signal generated by the photoelectric conversion element and the other of the source and the drain outputs the signal to transfer the signal to the amplification transistor, and a reset transistor that resets the signal transferred by the first transfer transistor. The pulse generation unit may generate each control signal for controlling the first transfer transistor and the reset transistor and supply each generated control signal to the first logical unit. The first logical unit may generate each driving signal for driving the first transfer transistor and the reset transistor based on each control signal and supply the generated driving signals to gates of the first transfer transistor and the reset transistor, respectively.

According to a fifty first aspect of the present invention, in the solid-state imaging device of the fiftieth aspect, the pixels arrayed in the pixel unit of the second substrate may each further include a load transistor which serves as load of the amplification transistor, a sample holding transistor of which one of a source and a drain receives an amplified signal input via the connector and samples and holds the amplified signal input and the other of the source and the drain outputs the sampled and held signal, an analog memory circuit which is a storage capacitor that stores the signal sampled and held by the sample and hold transistor, a clamp transistor that clamps the sampled and held signal stored by the storage capacitor connected to one of a source and a drain to a fixed potential connected to the other of the source and the drain, and an output transistor of which one of a source and a drain receives the sampled and held signal stored by the storage capacitor and the other of the source and the drain outputs the sampled and held signal as an output signal read from the pixel. The pulse generation unit may generate each control signal for controlling the load transistor, the sample and hold transistor, the clamp transistor, and the output transistor and supply each generated control signal to the second logical unit. The second logical unit may generate each driving signal for driving the load transistor, the sample holding transistor, the clamp transistor, and the output transistor based on each control signal and supply the generated driving signals to gates of the load transistor, the sample and hold transistor, the clamp transistor, and the output transistor, respectively.

According to a fifty second aspect of the present invention, in the solid-state imaging device of the thirty ninth aspect, the pixel may further include an analog memory circuit which is a storage capacitor that stores the signal generated by the photoelectric conversion element, and an amplification transistor of which a gate receives the signal generated by the photoelectric conversion element and one of a source and a drain outputs an amplified signal. The photoelectric conversion elements of all the pixels may be simultaneously reset. After a predetermined time passes, the signals generated by the photoelectric conversion elements may be simultaneously amplified by the amplification transistors of all the pixels. The amplified signals may be simultaneously stored in the storage capacitors of all the pixels. The amplified signals stored in the storage capacitors may be output as output signals sequentially read by the reading transistors.

According to a fifty third aspect of the present invention, there is provided an imaging device including a solid-state imaging device in which first and second substrates are electrically connected to each other via connectors and which includes a pixel unit, in which a plurality of pixels are arrayed two-dimensionally, each pixel including a photoelectric conversion element that is disposed in the first substrate and generates a signal according to an amount of incident light and a reading transistor which is disposed in the second substrate to correspond to the photoelectric conversion element and of which one of a source and a drain receives the signal generated by the corresponding photoelectric conversion element and the other of the source and the drain outputs the signal generated by the corresponding photoelectric conversion element, and a read control circuit that controls the reading of the signal from the pixel. The read control circuit includes a pulse generation unit that generates a control signal for controlling the reading of the signal from the pixel, a selection unit that selects at least a row of the pixels arrayed in the pixel unit of the second substrate based on the control signal, and a logical unit that generates a driving signal for driving each circuit element in the pixels of the selected row based on the control signal and supplies the generated driving signal to each circuit element of each of the pixels arrayed in the pixel unit. Among constituent elements included in the read control circuit, some of the constituent elements are disposed in the first substrate and remaining constituent elements of the read control circuit are disposed in the second substrate, and the constituent elements of the read control circuit disposed in the first substrate are electrically connected to the constituent elements of the read control circuit disposed in the second substrate via the connectors.

BRIEF DESCRIPTION OF THE DRAWINGS

FIG. 10A is a diagram illustrating the overview of a connection configuration of substrates of a solid-state imaging device according to the related art.

FIG. 10B is a diagram illustrating the overview of a connection configuration of substrates of a solid-state imaging device according to the related art.

DETAILED DESCRIPTION OF THE INVENTION

Hereinafter, an embodiment of the present invention will be described with reference to the drawings. The following description includes specific detailed contents as an example. However, those skilled in the art should, of course, understand that the detailed contents may be varied or modified and the variations and modifications of the contents are within the scope of the present invention. Accordingly, various exemplary embodiments to be described below will be described without loss of generality of the present invention described in the claims and without limitation on the present invention.

Figure 1:
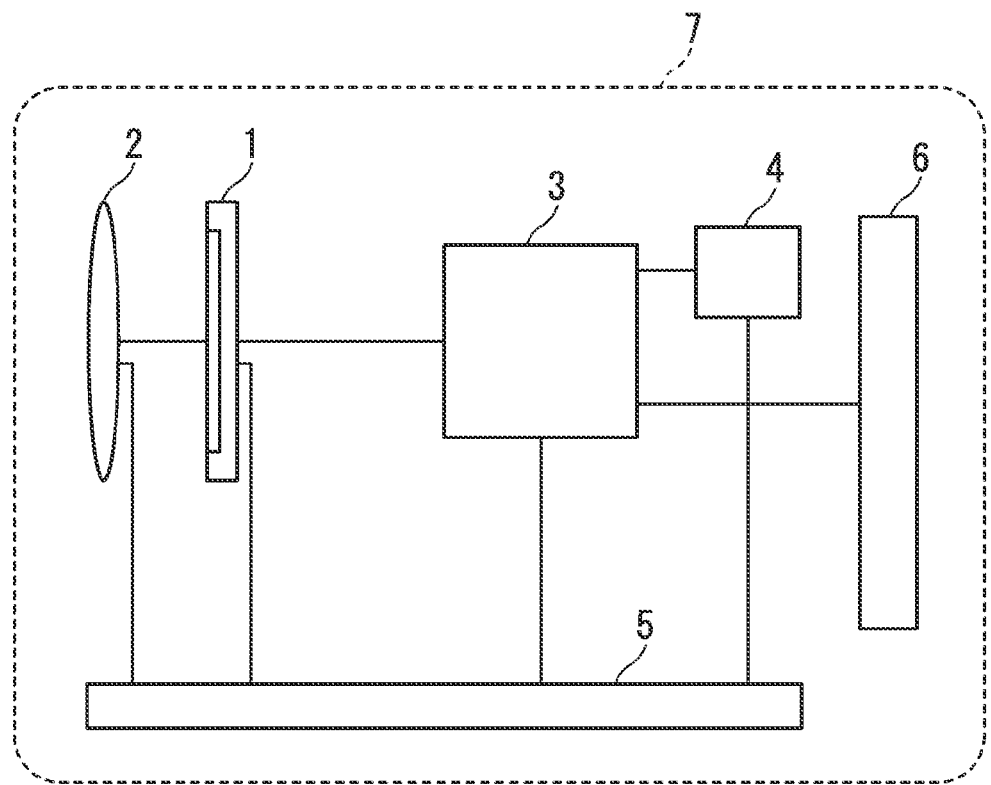
FIG. 1 is a block diagram illustrating a general configuration of a digital camera according to an embodiment of the present invention.

FIG. 1 is a block diagram illustrating a general configuration of a digital camera (for example, a digital single-lens camera system) according to the embodiment. Constituent elements shown herein may be realized by hardware components such as a CPU and a memory of a computer, or may also be realized by software such as a computer program. Here, each constituent element is illustrated as a functional block realized in association with the hardware and software. Accordingly, those skilled in the art should understand that the functional blocks are realized in various forms by the combination of the hardware and software.

A digital camera 7 shown in FIG. 1 includes a lens unit 2, a solid-state imaging device 1, an image signal processing device 3, a recording device 4, a camera control device 5, and a display device 6. The digital camera 7 shown in FIG. 1 is a digital camera that performs global exposure to simultaneously expose all of the pixels and does not include a mechanical shutter that shields the solid-state imaging device 1 from light.

In the lens unit 2, driving of zoom, focus, a stop, or the like is controlled by the camera control device 5 so that a subject image is formed in the solid-state imaging device 1.

The solid-state imaging device 1 is a MOS type solid-state imaging device that is driven and controlled by the camera control device 5 to convert subject light incident on the solid-state imaging device 1 via the lens unit 2 into an image signal. The solid-state imaging device 1 will be described in detail below.

The image signal processing device 3 performs processes such as amplification of a signal, conversion into image data, various corrections, or compression of image data on the image signal output from the solid-state imaging device 1. The image signal processing device 3 uses a memory (not shown) as a temporary storage unit that stores image data in each process.

The recording device 4 is a recording medium such as a semiconductor memory that may be detachably mounted, and records and reads the image data.

The display device 6 is a display device such as a liquid crystal device that displays an image based on the image data made from an image formed in the solid-state imaging device 1 and processed by the image signal processing device 3 or the image data read from the recording device 4.

The camera control device 5 is a control device that controls the entire digital camera 7.

First Embodiment

Figure 2:
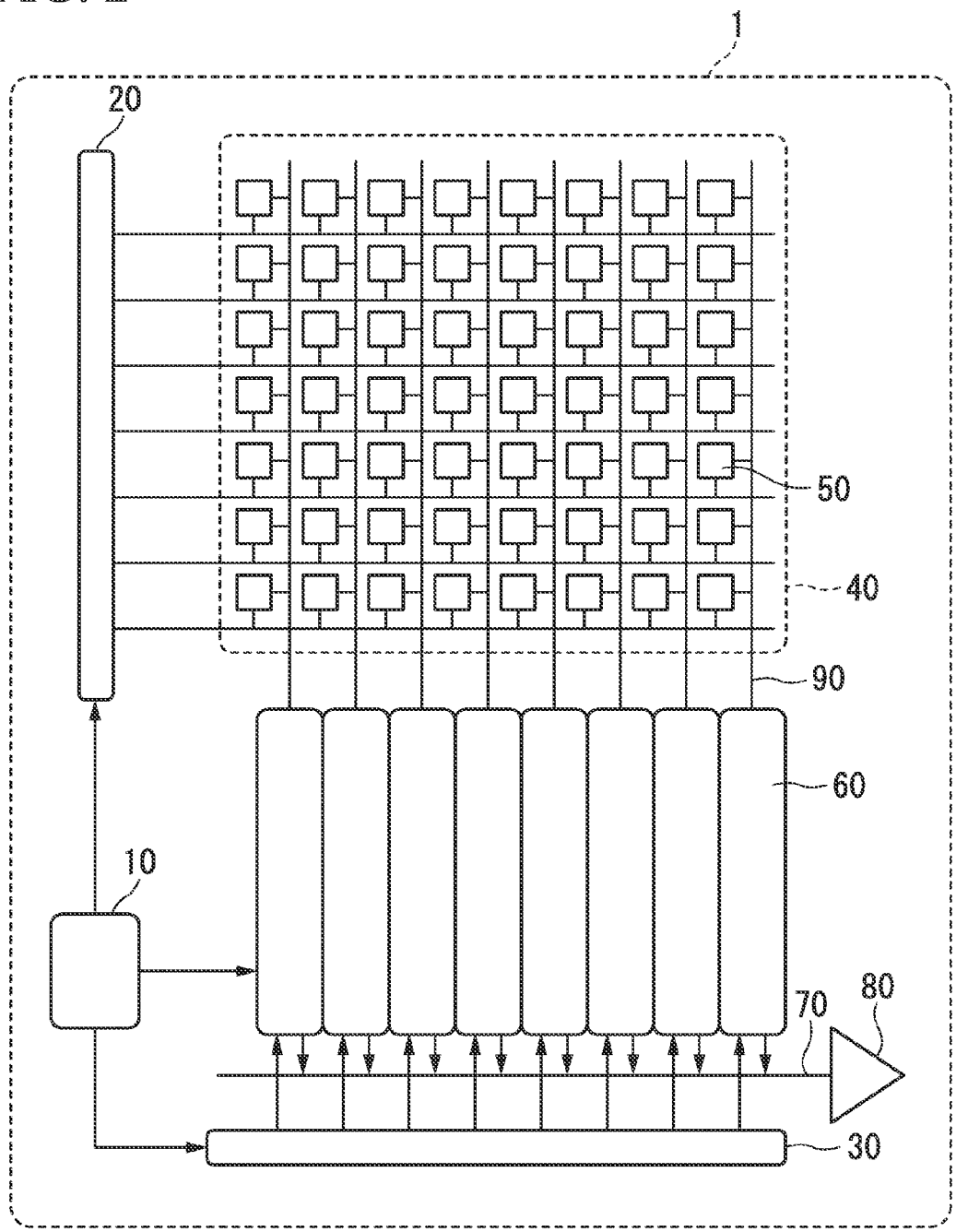
FIG. 2 is a block diagram illustrating a general configuration of a solid-state imaging device according to a first embodiment of the present invention.

Next, the solid-state imaging device 1 mounted on the digital camera 7 will be described according to a first embodiment. FIG. 2 is a block diagram illustrating a general configuration of the solid-state imaging device 1 according to the first embodiment. In FIG. 2, the solid-state imaging device 1 includes a solid-state imaging device control signal generation circuit 10, a vertical reading circuit 20, a horizontal reading circuit 30, a pixel array unit 40 including a plurality of unit pixels 50, column signal processing circuits 60, and an output amplifier 80. The solid-state imaging device 1 shown in FIG. 2 includes, for example, the pixel array unit 40 in which the plurality of unit pixels 50 are arrayed two-dimensionally in seven rows and eight columns.

The solid-state imaging device control signal generation circuit 10 controls the vertical reading circuit 20, the horizontal reading circuit 30, and the column signal processing circuit 60.

The vertical reading circuit 20 controls each unit pixel 50 in the pixel array unit 40 under the control of the solid-state imaging device control signal generation circuit 10 and outputs a pixel signal of each unit pixel 50 to a vertical signal line 90. The vertical reading circuit 20 outputs a control signal for controlling the unit pixels 50 to each row of the unit pixels 50 arrayed in the pixel array unit 40. The vertical reading circuit 20 will be described in detail below.

Each unit pixel 50 in the pixel array unit 40 converts incident subject light into a pixel signal and outputs the pixel signal according to the incident subject light to the vertical signal line 90 according to the control signal input from the vertical reading circuit 20. The unit pixel 50 will be described in detail below.

The column signal processing circuit 60 is a processing circuit that is disposed in each column of the pixel array unit 40 and performs a process such as a correlated double sampling (CDS) process of suppressing noise of the pixel signal output from the unit pixels 50 of each column to each vertical signal line 90 under the control of the solid-state imaging device control signal generation circuit 10. The column signal processing circuit 60 outputs an output signal obtained by performing a process on the pixel signal to the horizontal signal line 70 under the control of the horizontal reading circuit 30.

The horizontal reading circuit 30 sequentially reads, to the horizontal signal line 70, the output signals processed and output from the column signal processing circuits 60 which are each disposed in each column. The signals output from the column signal processing circuits 60 and read to the horizontal signal line 70 are output to the outside of the solid-state imaging device 1 via the output amplifier 80.

Figure 3:
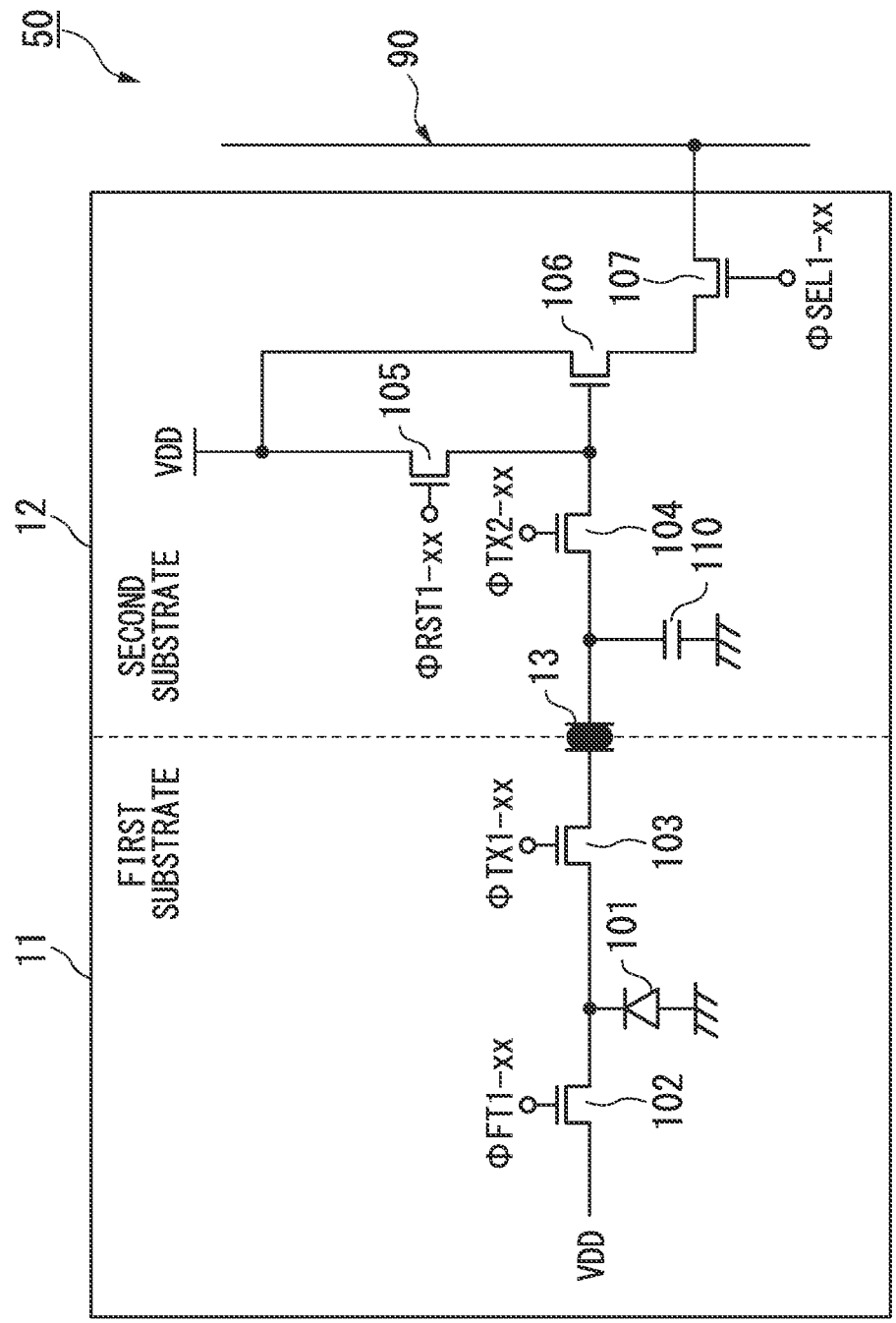
FIG. 3 is a circuit diagram illustrating a general configuration of a unit pixel in a pixel array unit of the solid-state imaging device according to the first embodiment.

Next, the unit pixel 50 arrayed in the pixel array unit 40 of the solid-state imaging device 1 according to the first embodiment will be described. FIG. 3 is a circuit diagram illustrating a general configuration of the unit pixel 50 in the pixel array unit 40 of the solid-state imaging device 1 according to the first embodiment. In FIG. 3, one unit pixel 50 is shown. The unit pixel 50 converts incident subject light into a pixel signal and outputs the converted pixel signal to the vertical signal line 90. The general configuration of the unit pixel 50 shown in FIG. 3 is the same as the configuration of a unit pixel in a solid-state imaging device according to the related art. However, in the solid-state imaging device 1 according to the first embodiment, as shown in FIG. 3, constituent elements of each unit pixel 50 are divided and disposed in the pixel unit 11 of the first substrate and the pixel unit 12 of the second substrate.

In FIG. 3, the unit pixel 50 includes a photoelectric conversion element 101, a photoelectric conversion element reset transistor 102, and a first transfer transistor 103 formed in the pixel unit 11 of the first substrate, and includes a second transfer transistor 104, a pixel reset transistor 105, a first amplification transistor 106, a selection transistor 107, and a charge storage element 110 formed in the pixel unit 12 of the second substrate. The pixel unit 11 of the first substrate and the pixel unit 12 of the second substrate are connected via the inter-substrate connectors 13.

The inter-substrate connector 13 is a connector that electrically connects the first and second substrates to each other. As the inter-substrate connector 13, a bump or the like manufactured by, for example, a deposition method or a plating method is used.

A space between the first and second substrates may be filled with an insulation member such as an adhesive. The first and second substrates transmit and receive signals via the inter-substrate connectors 13. In the unit pixel 50 shown in FIG. 3, the first transfer transistor 103 in the pixel unit 11 of the first substrate is connected to the second transfer transistor 104 and the charge storage element 110 in the pixel unit 12 of the second substrate via the inter-substrate connector 13.

The photoelectric conversion element 101 photoelectrically converts incident light to generate a signal charge and stores the signal charge as a photoelectric conversion signal.

The first transfer transistor 103 transfers the photoelectric conversion signal stored in the photoelectric conversion element 101 to the charge storage element 110 via the inter-substrate connector 13 according to a transfer pulse signal ΦTX1-xx input from the vertical reading circuit 20.

The charge storage element 110 is a capacitor that retains (stores) the photoelectric conversion signal. The photoelectric conversion signal transferred by the first transfer transistor 103 is stored in the charge storage element 110.

In a signal name "transfer pulse signal ΦTX1-xx" of the above-described control signal, the portion "xx" suffixed to the name "transfer pulse signal ΦTX1" of the control signal with "-" indicates a row number of the unit pixel 50 arrayed in the pixel array unit 40. In the following description, a reference numeral of a row number of the unit pixel 50 arrayed in the pixel array unit 40 is described in the portion "xx" of each control signal, in addition to the above-described transfer pulse signal ΦTX1. When a reference numeral of a row number is not described in the portion "xx" and only "xx" is listed, a control signal in such a description is not a control signal of a specific row of the pixel array unit 40, but a control signal different for each row of the pixel array unit 40 and indicates a control signal considered to have an appropriate row number.

The second transfer transistor 104 transfers the photoelectric conversion signal retained (stored) in the charge storage element 110 to a gate terminal of the first amplification transistor 106 according to a transfer pulse signal ΦTX2-xx input from the vertical reading circuit 20.

The first amplification transistor 106 outputs a signal voltage according to the photoelectric conversion signal transferred to the gate terminal.

The selection transistor 107 outputs the signal voltage output by the first amplification transistor 106 as a pixel signal output by the unit pixel 50 to the vertical signal line 90 according to a row selection pulse signal ΦSEL1-xx input from the vertical reading circuit 20.

The photoelectric conversion element reset transistor 102 resets the photoelectric conversion element 101 to a power supply voltage VDD according to a reset pulse signal ΦFT1-xx input from the vertical reading circuit 20.

The pixel reset transistor 105 resets a signal in the unit pixel 50 to the power supply voltage VDD according to a reset pulse signal ΦRST1-xx input from the vertical reading circuit 20.

The solid-state imaging device 1 corresponds to exposure of a system (hereinafter referred to as a "rolling shutter system") in which the unit pixels 50 arrayed in the pixel array unit 40 are sequentially exposed for each row and exposure of a global shutter system in which all of the unit pixels 50 arrayed in the pixel array unit 40 are simultaneously exposed. Further, in the solid-state imaging device 1, the vertical reading circuit 20 controls the unit pixels 50 according to each exposure system.

More specifically, when the exposure of the rolling shutter system is performed, the vertical reading circuit 20 sequentially performs start of photoelectric conversion by the photoelectric conversion elements 101 of the unit pixels 50 and transfer (retention) of the photoelectric conversion signals stored by the photoelectric conversion elements 101 to the charge storage elements 110 by sequentially outputting the reset pulse signal ΦFT1-xx and the transfer pulse signal ΦTX1-xx for each row. When the exposure of the global shutter system is performed, the vertical reading circuit 20 causes the photoelectric conversion elements 101 of all the unit pixels 50 to simultaneously start the photoelectric conversion by simultaneously outputting the reset pulse signals ΦFT1-xx of all the unit pixels 50. Then, after an exposure time determined in advance passes, the vertical reading circuit 20 simultaneously outputs the transfer pulse signals ΦTX1-xx of all the unit pixels 50, and simultaneously transfers and retains the photoelectric conversion signals stored by the photoelectric conversion elements 101 of all the unit pixels 50 to and in the charge storage elements 110.

Thereafter, in the solid-state imaging device 1, the vertical reading circuit 20 sequentially controls the unit pixels 50 for each row and thus outputs the pixel signals photoelectrically converted by the unit pixels 50, respectively, to the vertical signal lines 90.

More specifically, the vertical reading circuit 20 sequentially outputs (reads) the photoelectric conversion signals respectively retained in the charge storage elements 110 as the pixel signals to the vertical signal lines 90 by controlling the transfer pulse signal ΦTX2-xx, the reset pulse signal ΦRST1-xx, and the row selection pulse signal ΦSEL1-xx for each row of the unit pixels 50. As each unit pixel 50 includes the charge storage element 110, the quality of a signal is prevented from deteriorating due to noise caused by leakage or the like occurring until the reading from each unit pixel 50.

Next, the vertical reading circuit 20 in the solid-state imaging device 1 according to the first embodiment will be described.

Figure 4:
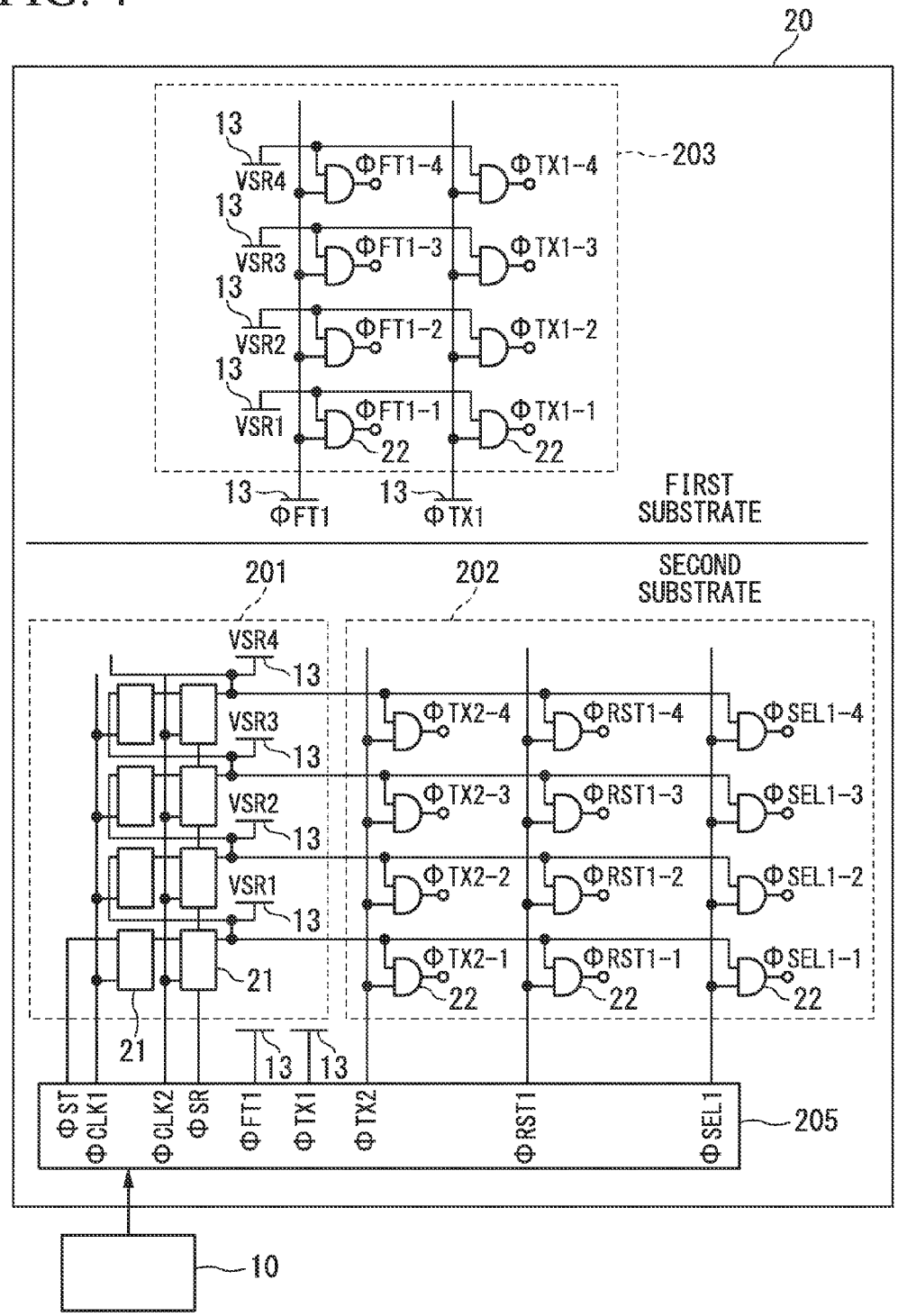
FIG. 4 is a circuit diagram illustrating a general configuration of a vertical reading circuit in the solid-state imaging device according to the first embodiment.

FIG. 4 is a circuit diagram illustrating a general configuration of the vertical reading circuit 20 in the solid-state imaging device 1 according to the first embodiment. The vertical reading circuit 20 outputs the control signals to the unit pixels 50 to control the unit pixels 50 arrayed in the pixel array unit 40 for each row and outputs the pixel signals of the unit pixels 50 of each row to the vertical signal lines 90 under the control of the solid-state imaging device control signal generation circuit 10. FIG. 4 shows an example of the vertical reading circuit 20 that controls the unit pixels 50 arrayed two-dimensionally in four rows and one column in the pixel array unit 40 for each row.

In FIG. 4, the vertical reading circuit 20 includes: a vertical selection unit 201 that selects the unit pixels 50 of a specific row arrayed in the pixel array unit 40, a logical unit 202 that generates a control signal of each transistor formed in the pixel unit 12 of the second substrate in the unit pixels 50 of the row selected by the vertical selection unit 201, a logical unit 203 that generates a control signal of each transistor formed in the pixel unit 11 of the first substrate in the unit pixels 50 of the row selected by the vertical selection unit 201, and a pulse generation unit 205 that generates a control signal (pulse signal) for causing the vertical selection unit 201, the logical unit 202, and the logical unit 203 to control the unit pixels 50.

The general configuration of the vertical reading circuit 20 shown in FIG. 4 is the same as the configuration of a vertical reading circuit of a solid-state imaging apparatus according to the related art. However, in the solid-state imaging device 1 according to the first embodiment, as shown in FIG. 4, the constituent elements of the vertical reading circuit 20 are divided and disposed in the first and second substrates.

More specifically, in the vertical reading circuit 20, the vertical selection unit 201, the logical unit 202, and the pulse generation unit 205 are disposed in the second substrate, and the logical unit 203 is disposed in the first substrate. Further, the logical unit 203 disposed in the first substrate is connected to the vertical selection unit 201 and the pulse generation unit 205 disposed in the second substrate via inter-substrate connectors 13, as in the connection between the pixel unit 11 of the first substrate and the pixel unit 12 of the second substrate in the unit pixels 50 shown in FIG. 3. That is, in the vertical reading circuit 20, the vertical selection unit 201 and the pulse generation unit 205 are disposed only in the second substrate and a row selecting signal generated by the vertical selection unit 201 is output to the logical unit 203 disposed in the first substrate via the inter-substrate connectors 13. Further, some of the signals generated by the pulse generation unit 205 are output to the logical unit 203 disposed in the first substrate via the inter-substrate connectors 13.

Since the inter-substrate connector 13 is a connector that electrically connects the first and second substrates to each other, as in the inter-substrate connector 13 shown in FIG. 3, the detailed description will not be repeated here. In the vertical reading circuit 20 shown in FIG. 4, row selecting signals VSR1 to VSR4 of the logical unit 203 of the first substrate are connected to the row selecting signals VSR1 to VSR4 of the vertical selection unit 201 of the second substrates via the inter-substrate connectors 13. Further, the reset pulse signal ΦFT1 and the transfer pulse signal ΦTX1 of the logical unit 203 of the first substrate are connected to the reset pulse signal ΦFT1 and the transfer pulse signal ΦTX1 of the pulse generation unit 205 of the second substrate via the inter-substrate connectors 13, respectively.

The pulse generation unit 205 generates control signals (a pixel selecting signal ΦST, clock signals ΦCLK1 and ΦCLK2, and a whole pixel selecting signal OR) for selecting the unit pixels 50 arrayed in the pixel array unit 40 under the control of the solid-state imaging device control signal generation circuit 10. Further, the pulse generation unit 205 outputs the generated control signals for selecting the unit pixels 50 to the vertical selection unit 201.

The pulse generation unit 205 generates pulse signals (a transfer pulse signal ΦTX1, a transfer pulse signal ΦTX2, a row selection pulse signal ΦSEL1, a reset pulse signal ΦFT1, and a reset pulse signal ΦRST1) for controlling the unit pixels 50 arrayed in the pixel array unit 40 as control signals under the control of the solid-state imaging device control signal generation circuit 10. Further, the pulse generation unit 205 outputs each of the generated control signals for controlling the unit pixels 50 to the logical unit 202 or 203.

The vertical selection unit 201 generates the row selecting signals VSR1 to VSR4 for selecting the unit pixels 50 arrayed in the pixel array unit 40 for each row based on the control signals for selecting the unit pixels 50 and input from the pulse generation unit 205. Further, the vertical selection unit 201 outputs the generated row selecting signals VSR1 to VSR4 to the logical units 202 and 203. The vertical selection unit 201 includes, for example, a shift register in which a plurality of flip-flops 21 are connected.

According to the control signals (the pixel selecting signal ΦST, the clock signals ΦCLK1 and ΦCLK2, and the whole pixel selecting signal ΦSR) input from the pulse generation unit 205, the vertical selection unit 201 may cause the unit pixels 50 arrayed in the pixel array unit 40 to be sequentially selected for each row or may cause all of the unit pixels 50 to be simultaneously selected. Thus, the pulse signals generated by the pulse generation unit 205 are output to the transistors of the unit pixels 50 via the logical units 202 and 203.

When the solid-state imaging device 1 performs the exposure of the rolling shutter system, the vertical selection unit 201 generates the row selecting signals VSR1 to VSR4 for sequentially selecting the unit pixels 50 arrayed in the pixel array unit 40 for each row based on the pixel selecting signal ΦST and the clock signals ΦCLK1 and ΦCLK2 input from the pulse generation unit 205.

When the solid-state imaging device 1 performs the exposure of the global shutter system, the vertical selection unit 201 generates the row selecting signals VSR1 to VSR4 for simultaneously selecting all of the unit pixels 50 arrayed in the pixel array unit 40 based on the whole pixel selecting signal ΦSR input from the pulse generation unit 205.

Based on the row selecting signals VSR1 to VSR4 input from the vertical selection unit 201, the logical unit 202 outputs the pulse signals (the transfer pulse signal ΦTX2, the row selection pulse signal ΦSEL1, and the reset pulse signal ΦRST1) input from the pulse generation unit 205 to each transistor formed in the pixel unit 12 of the second substrate in the unit pixels 50. The logical unit 202 includes, for example, logical elements such as a plurality of logic AND circuits (AND circuits) 22.

More specifically, based on the row selecting signals VSR1 to VSR4, the logical unit 202 selects a row of the unit pixels 50 arrayed in the pixel array unit 40 to output the transfer pulse signal ΦTX2, the row selection pulse signal ΦSEL1, and the reset pulse signal ΦRST1. Then, the logical unit 202 generates the pulse signals (transfer pulse signals ΦTX2-1 to 4, row selection pulse signals ΦSEL1-1 to 4, and reset pulse signals ΦRST1-1 to 4) configured to operate each transistor in the unit pixels 50 of the selected row and not to operate each transistor in the unit pixels 50 of a non-selected row. Then, the logical unit 202 outputs the generated transfer pulse signals ΦTX2-1 to 4, the generated row selection pulse signals ΦSEL1-1 to 4, and the generated reset pulse signals ΦRST1-1 to 4 to each transistor formed in the pixel unit 12 of the second substrate in all the unit pixels 50 arrayed in the pixel array unit 40.

Thus, the transfer pulse signal ΦTX2, the row selection pulse signal ΦSEL1, and the reset pulse signal ΦRST1 input from the pulse generation unit 205 are output only to each transistor formed in the pixel unit 12 of the second substrate in the unit pixels 50 of the selected row.

Based on the row selecting signals VSR1 to VSR4 input from the vertical selection unit 201 via the inter-substrate connectors 13, the logical unit 203 outputs the pulse signals (the transfer pulse signal ΦTX1 and the reset pulse signal ΦFT1) input from the pulse generation unit 205 to each transistor formed in the pixel unit 11 of the first substrate in the unit pixels 50 via the inter-substrate connectors 13. The logical unit 203 includes, for example, logical elements such as a plurality of logic AND circuits (AND circuits) 22.

More specifically, based on the row selecting signals VSR1 to VSR4, the logical unit 203 selects a row of the unit pixels 50 arrayed in the pixel array unit 40 to output the transfer pulse signal ΦTX1 and the reset pulse signal ΦFT1. Then, the logical unit 203 generates the pulse signals (transfer pulse signals ΦTX1-1 to 4 and reset pulse signals ΦFT1-1 to 4) configured to operate each transistor in the unit pixels 50 of the selected row and configured not to operate each transistor in the unit pixels 50 of a non-selected row. Then, the logical unit 203 outputs the generated transfer pulse signals ΦTX1-1 to 4 and the generated reset pulse signals ΦFT1-1 to 4 to each transistor formed in the pixel unit 11 of the first substrate in all the unit pixels 50 arrayed in the pixel array unit 40.

Thus, the transfer pulse signal ΦTX1 and the reset pulse signal ΦFT1 input from the pulse generation unit 205 via the inter-substrate connectors 13 are output only to each transistor formed in the pixel unit 11 of the first substrate in the unit pixels 50 of the selected row.

In such a configuration, the solid-state imaging device 1 performs the exposure of the rolling shutter system and the exposure of the global shutter system. When the solid-state imaging device 1 performs the exposure of the rolling shutter system, the vertical reading circuit 20 sequentially controls the start of the photoelectric conversion performed by the photoelectric conversion elements 101 formed in the pixel unit 11 of the first substrate and the transfer (retention) of the photoelectric conversion signals stored by the photoelectric conversion elements 101 to the charge storage elements 110 for each row based on the transfer pulse signals ΦTX1-1 to 4 and the reset pulse signals ΦFT1-1 to 4.

When the solid-state imaging device 1 performs the exposure of the global shutter system, the vertical reading circuit 20 simultaneously controls the start of the photoelectric conversion performed by all the photoelectric conversion elements 101 formed in the pixel unit 11 of the first substrate and the transfer (retention) of the photoelectric conversion signals stored by all the photoelectric conversion elements 101 to the charge storage elements 110 based on the transfer pulse signals ΦTX1-1 to 4 and the reset pulse signals ΦFT1-1 to 4.

When the solid-state imaging device 1 reads the photoelectric conversion signals retained in the charge storage elements 110, the vertical reading circuit 20 sequentially outputs (reads) the pixel signals to the vertical signal lines 90 by controlling the transfer pulse signals ΦTX2-1 to 4, the row selection pulse signals ΦSEL1-1 to 4, and the reset pulse signals ΦRST1-1 to 4 for each row.

As described above, in the solid-state imaging device 1 according to the first embodiment, the constituent elements (the logical units 202 and 203) in the vertical reading circuit 20 are divided and disposed in the first and second substrates. Thus, in the solid-state imaging device 1 according to the first embodiment, the vertical reading circuit 20 may be configured without an increase in a circuit size, as in a case in which the vertical reading circuit is configured in each substrate.

In the solid-state imaging device 1 according to the first embodiment, one vertical selection unit 201 and one pulse generation unit 205 determine an output timing of the control signals (pulse signals) for controlling each constituent element in each unit pixel 50. Thus, in the solid-state imaging device 1 according to the first embodiment, each constituent element in each unit pixel 50 may be controlled without occurrence of timing deviation in the control signals (pulse signals) for controlling the transistors of the unit pixels 50 divided into the pixel unit 11 of the first substrate and the pixel unit 12 of the second substrate.

In the solid-state imaging device 1 according to the first embodiment, the logical units 203 and 202 output the corresponding control signals (pulse signals) to the transistors of the unit pixels 50 divided and disposed in the pixel unit 11 of the first substrate and the pixel unit 12 of the second substrate, respectively, based on the control signals (pulse signals) output from the vertical selection unit 201 and the pulse generation unit 205 disposed in the second substrate. That is, the control signals (pulse signals) output to each transistor formed in the pixel unit 11 of the first substrate are generated within the first substrate and the control signals (pulse signals) output to each transistor formed in the pixel unit 12 of the second substrate are generated within the second substrate. Thus, in the solid-state imaging device 1 according to the first embodiment, the number of inter-substrate connectors 13 connecting the signals of the first substrate and the signals of the second substrate may be reduced, compared to a case in which all of the control signals (pulse signals) output to the transistors formed in the pixel unit 11 of the first substrate and the pixel unit 12 of the second substrate are generated in one of the substrates.

For example, a case in which the unit pixels 50 shown in FIG. 3 are included in the pixel array unit 40 is considered. At this time, in a solid-state imaging device according to the related art in which the vertical reading circuit 20 is disposed in the second substrate, control signals (pulse signals) for controlling two transistors, the photoelectric conversion element reset transistor 102 and the first transfer transistor 103, formed in the pixel unit 11 of the first substrate are each connected from the second substrate to the first substrate via the inter-substrate connectors 13. In the solid-state imaging device 1 according to the first embodiment, on the other hand, the row selecting signals VSR of the number of rows of the unit pixels 50 arrayed in the pixel array unit 40 and two pulse signals (the reset pulse signal ΦFT1 and the transfer pulse signal ΦTX1) for controlling each of the photoelectric conversion element reset transistor 102 and the first transfer transistor 103 formed in the pixel unit 11 of the first substrate are connected from the second substrate to the first substrate via the inter-substrate connectors 13.

That is, in the solid-state imaging device according to the related art, it is necessary to provide the inter-substrate connectors 13 corresponding to 2☐ the number of rows of the unit pixels 50 arrayed in the pixel array unit 40. In the solid-state imaging device 1, however, it is necessary to provide only the inter-substrate connectors 13 corresponding to 2+ the number of rows of the unit pixels 50 arrayed in the pixel array unit 40.

Therefore, in the solid-state imaging device 1 according to the first embodiment, it is possible to reduce the number of inter-substrate connectors 13 by almost the number of rows of the unit pixels 50 arrayed in the pixel array unit 40.

Figure 5A:
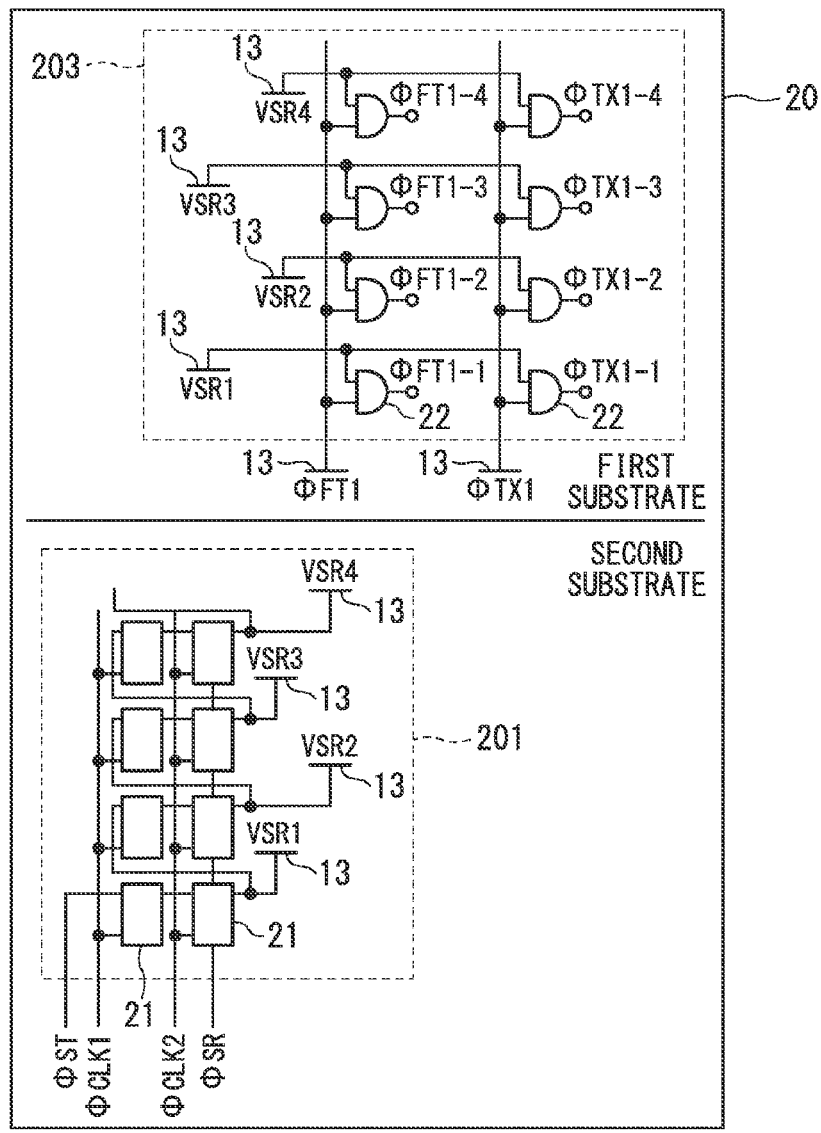
FIG. 5A is a diagram schematically illustrating an example of disposition of inter-substrate connectors in the vertical reading circuit in the solid-state imaging device according to the first embodiment.
Figure 5B:
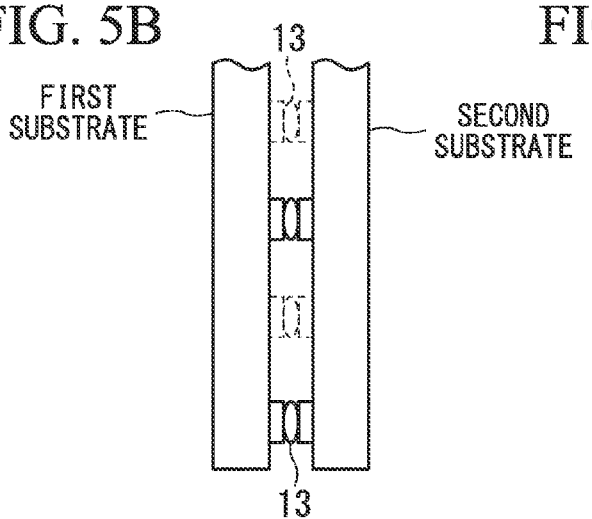
FIG. 5B is a diagram schematically illustrating an example of the disposition of the inter-substrate connectors in the vertical reading circuit in the solid-state imaging device according to the first embodiment.
Figure 5C:
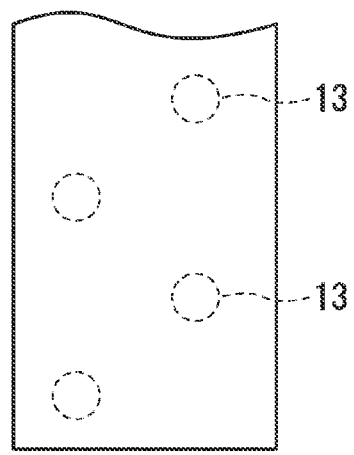
FIG. 5C is a diagram schematically illustrating an example of the disposition of the inter-substrate connectors in the vertical reading circuit in the solid-state imaging device according to the first embodiment.

Here, connection of the constituent elements of the vertical reading circuit 20 divided and disposed in the first and second substrates in the solid-state imaging device 1 according to the first embodiment will be described. In particular, dispositions of the inter-substrate connectors 13 connecting the signals (the row selecting signals VSR1 to VSR4) of the vertical selection unit 201 disposed in the second substrate and the signals (the row selecting signals VSR1 to VSR4) of the logical unit 203 disposed in the first substrate will be described. FIGS. 5A, 5B, and 5C are diagrams schematically illustrating an example of the disposition of the inter-substrate connectors 13 in the vertical reading circuit 20 in the solid-state imaging device 1 according to the first embodiment. FIG. 5A is a circuit diagram illustrating a general configuration of the vertical reading circuit 20. FIG. 5B is a side view illustrating the disposition of the inter-substrate connectors 13 in the portion of the vertical reading circuit 20 of the solid-state imaging device 1. FIG. 5C is a top view illustrating the disposition of the inter-substrate connectors 13 in the portion of the vertical reading circuit 20 of the solid-state imaging device 1.

In the solid-state imaging device 1 according to the first embodiment, the inter-substrate connectors 13 connecting the row selecting signals VSR1 to VSR4 of the first and second substrates may be disposed to match the disposition of the unit pixels 50 arrayed in the pixel array unit 40 in a line. However, for example, the inter-substrate connectors 13 may be disposed in a zigzag form in which the positions of the inter-substrate connectors 13 are changed for each row, as shown in FIGS. 5A, 5B, and 5C. Thus, a connection pitch between two adjacent inter-substrate connectors 13 may be widened by changing the disposition of the inter-substrate connectors 13. Therefore, a decrease in a yield ratio at the time of connecting the first and second substrates may be suppressed. Further, since the connection pitch between the inter-substrate connectors 13 may be widened, the size of the inter-substrate connector 13 may be enlarged. Thus, the decrease in the yield ratio may be further suppressed.

Second Embodiment

Next, a solid-state imaging device mounted on the digital camera 7 will be described according to a second embodiment.

The solid-state imaging device according to the second embodiment is a solid-state imaging device that corresponds only to exposure of the global shutter system. The solid-state imaging device according to the second embodiment has the same constituent elements as the solid-state imaging device 1 according to the first embodiment except that the vertical reading circuit 20 in the solid-state imaging device 1 shown in FIG. 2 in the first embodiment is different. Accordingly, the same reference numerals are given to the constituent elements of the solid-state imaging device of the second embodiment which are the same as the constituent elements of the solid-state imaging device 1 shown in FIG. 2 in the first embodiment, and the detailed description will not be repeated here.

Figure 6:
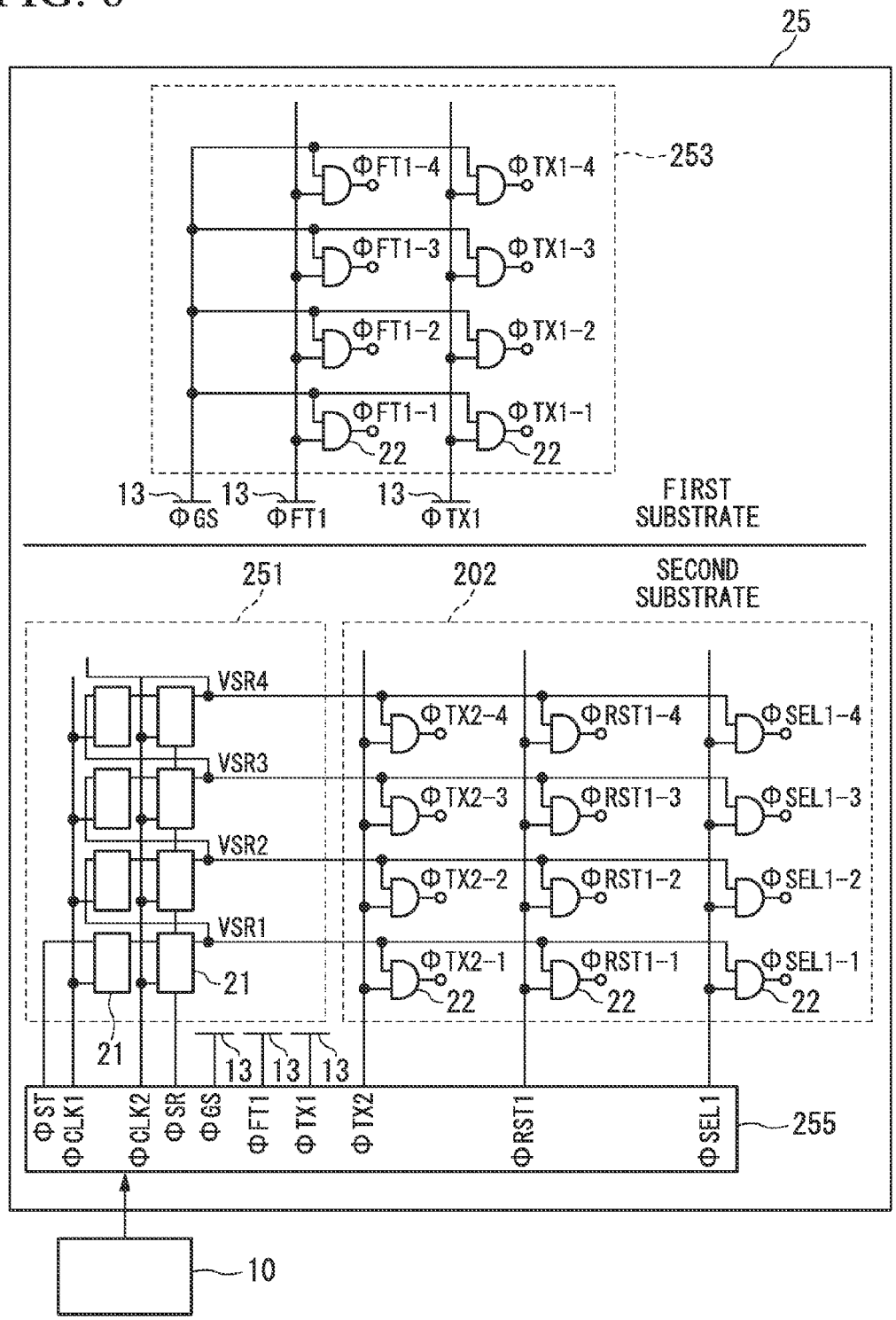
FIG. 6 is a circuit diagram illustrating a general configuration of a vertical reading circuit in a solid-state imaging device according to a second embodiment of the present invention.

FIG. 6 is a circuit diagram illustrating a general configuration of a vertical reading circuit 25 in the solid-state imaging device according to the second embodiment. As in the vertical reading circuit 20 shown in FIG. 4, the vertical reading circuit 25 outputs a control signal to each unit pixel 50 to control the unit pixels 50 arrayed in the pixel array unit 40 for each row and outputs the pixel signals of the unit pixels 50 of each row to the vertical signal lines 90 under the control of the solid-state imaging device control signal generation circuit 10. FIG. 6 shows an example of the vertical reading circuit 25 that controls the unit pixels 50 arrayed two-dimensionally in four rows and one column in the pixel array unit 40 for each row, as in the vertical reading circuit 20 shown in FIG. 4.

In FIG. 6, the vertical reading circuit 25 includes: a vertical selection unit 251 that selects the unit pixels 50 of a specific row arrayed in the pixel array unit 40, a logical unit 202 that generates a control signal of each transistor formed in the pixel unit 12 of the second substrate in the unit pixels 50 of the row selected by the vertical selection unit 251, a logical unit 253 that generates a control signal of each transistor formed in the pixel unit 11 of the first substrate in all the unit pixels 50, and a pulse generation unit 255 that generates a control signal (pulse signal) for causing the vertical selection unit 251, the logical unit 202, and the logical unit 253 to control the unit pixels 50.

In the vertical reading circuit 25, the constituent elements of the vertical reading circuit 25 are divided and disposed in the first and second substrates, as in the vertical reading circuit 20 shown in FIG. 4. That is, even in the vertical reading circuit 25, the vertical selection unit 251, the logical unit 202, and the pulse generation unit 255 are disposed in the second substrate, and the logical unit 253 is disposed in the first substrate. The logical unit 253 disposed in the first substrate is connected to the constituent elements of the vertical reading circuit 25 disposed in the second substrate via the inter-substrate connectors 13, as in the vertical reading circuit 20 shown in FIG. 4.

However, the solid-state imaging device according to the second embodiment is a solid-state imaging device that corresponds only to the exposure of the global shutter system. Accordingly, in the vertical reading circuit 25, the logical unit 253 disposed in the first substrate is connected only to the pulse generation unit 255 disposed in the second substrate by the inter-substrate connectors 13. That is, as shown in FIG. 6, the vertical reading circuit 25 is different from the vertical reading circuit 20 in that the row selecting signals VSR1 to VSR4 in the vertical reading circuit 20 shown in FIG. 4 are not connected to the logical unit 253 disposed in the first substrate. Further, in the vertical reading circuit 25, a global shutter signal ΦGS of the pulse generation unit 255 of the second substrate is connected via the inter-substrate connectors 13 instead of the row selecting signals VSR1 to VSR4.

Since the above-described vertical reading circuit 20 is different from the vertical reading circuit 25, the vertical selection unit 251, the logical unit 253, and the pulse generation unit 255 of the vertical reading circuit 25 are different from the vertical selection unit 201, the logical unit 203, and the pulse generation unit 205 of the vertical reading circuit 20 shown in FIG. 4.

The pulse generation unit 255 generates control signals (a pixel selecting signal ΦST, clock signals ΦCLK1 and ΦCLK2, a whole pixel selecting signal ΦSR, and the global shutter signal ΦGS) for selecting the unit pixels 50 arrayed in the pixel array unit 40 under the control of the solid-state imaging device control signal generation circuit 10. Further, the pulse generation unit 255 outputs the generated control signals for selecting the unit pixels 50 to the vertical selection unit 251 or the logical unit 253.

The pulse generation unit 255 generates pulse signals (a transfer pulse signal ΦTX1, a transfer pulse signal (ΦTX2, a row selection pulse signal ΦSEL1, a reset pulse signal ΦFT1, and a reset pulse signal ΦRST1) for controlling the unit pixels 50 arrayed in the pixel array unit 40 as control signals under the control of the solid-state imaging device control signal generation circuit 10. Further, the pulse generation unit 255 outputs each of the generated control signals for controlling the unit pixels 50 to the logical unit 202 or 253. Since the pulse signals generated by the pulse generation unit 255 and used to control the unit pixels 50 are the same as the pulse signals generated and output by the pulse generation unit 205 of the vertical reading circuit 20 shown in FIG. 4, the detailed description will not be repeated here.

The vertical selection unit 251 generates the row selecting signals VSR1 to VSR4 for selecting the unit pixels 50 arrayed in the pixel array unit 40 for each row, based on the control signals (the pixel selecting signal ΦST and the clock signals ΦCLK1 and ΦCLK2) input from the pulse generation unit 255, as in the vertical selection unit 201 of the vertical reading circuit 20 shown in FIG. 4. However, the vertical selection unit 251 outputs the generated row selecting signals VSR1 to VSR4 only to the logical unit 202 and outputs each pulse signal generated by the pulse generation unit 255 to each transistor formed in the pixel unit 12 of the second substrate via the logical unit 202 in the unit pixels 50. Further, as in the vertical selection unit 201 of the vertical reading circuit 20 shown in FIG. 4, the vertical selection unit 251 includes, for example, a shift register in which a plurality of flip-flops 21 are connected.

The vertical selection unit 251 may also generate the row selecting signals VSR1 to VSR4 for simultaneously selecting all of the rows of the pixel unit 12 of the second substrate based on the whole pixel selecting signal FSR input from the pulse generation unit 255. That is, the vertical selection unit 251 may simultaneously output each pulse signal generated by the pulse generation unit 255 to each transistor formed in the pixel unit 12 of the second substrate in the unit pixels 50 of all the rows via the logical unit 202. Since the operation of the vertical selection unit 251 is the same as the operation of the vertical selection unit 201 of the vertical reading circuit 20 shown in FIG. 4, the detailed description will not be repeated here.

Based on the row selecting signals VSR1 to VSR4 input from the vertical selection unit 251, the logical unit 202 outputs the pulse signals (the transfer pulse signal ΦTX2, the row selection pulse signal ΦSEL1, and the reset pulse signal ΦRST1) input from the pulse generation unit 255 to each transistor formed in the pixel unit 12 of the second substrate in the unit pixels 50. Since the operation of the logical unit 202 is the same as the operation of the logical unit 202 of the vertical reading circuit 20 shown in FIG. 4 except that each pulse signal input from the pulse generation unit 255 is output, the detailed description will not be repeated here.

Based on the global shutter signal FGS input from the pulse generation unit 255 via the inter-substrate connectors 13, the logical unit 253 simultaneously outputs the pulse signals (the transfer pulse signal ΦTX1 and the reset pulse signal ΦFT1) input from the pulse generation unit 255 via the inter-substrate connectors 13 to each transistor formed in the pixel unit 11 of the first substrate in the unit pixels 50 of all the rows. The logical unit 253 includes, for example, logical elements such as a plurality of logic AND circuits (AND circuits) 22.

More specifically, based on the global shutter signal FGS, the logical unit 253 selects all of the rows of the unit pixels 50 arrayed in the pixel array unit 40 to output the transfer pulse signal ΦTX1 and the reset pulse signal ΦFT1. Then, the logical unit 253 generates the pulse signals (transfer pulse signals ΦTX1-1 to 4 and reset pulse signals ΦFT1-1 to 4) configured to operate each transistor in the unit pixels 50 of all the rows. Then, the logical unit 253 simultaneously outputs the generated transfer pulse signals ΦTX1-1 to 4 and the generated reset pulse signals ΦFT1-1 to 4 to each transistor formed in the pixel unit 11 of the first substrate in all the unit pixels 50 arrayed in the pixel array unit 40.

Thus, the transfer pulse signal ΦTX1 and the reset pulse signal ΦFT1 input from the pulse generation unit 255 via the inter-substrate connectors 13 are simultaneously output to each transistor formed in the pixel unit 11 of the first substrate in the unit pixels 50 of all the rows.

In such a configuration, when the solid-state imaging device according to the second embodiment performs the exposure of the global shutter system, the vertical reading circuit 25 simultaneously outputs the transfer pulse signals ΦTX1-1 to 4 and the reset pulse signals ΦFT1-1 to 4 to all of the unit pixels 50. Thus, the vertical reading circuit 25 simultaneously controls the start of the photoelectric conversion by all the photoelectric conversion elements 101 formed in the pixel unit 11 of the first substrate and the transfer (retention) of the photoelectric conversion signals stored by the photoelectric conversion elements 101 to the charge storage elements 110.

When the solid-state imaging device 1 reads the photoelectric conversion signals retained in the charge storage elements 110, the vertical reading circuit 25 sequentially outputs (reads) the pixel signals to the vertical signal lines 90 by controlling the transfer pulse signals ΦTX2-1 to 4, the row selection pulse signals ΦSEL1-1 to 4, and the reset pulse signals ΦRST1-1 to 4 for each row.

As described above, even in the solid-state imaging device according to the second embodiment, the constituent elements (the logical units 202 and 253) in the vertical reading circuit 25 are divided and disposed in the first and second substrates, as in the solid-state imaging device 1 of the first embodiment. Further, one vertical selection unit 251 and the pulse generation unit 255 determine an output timing of the control signals (pulse signals) for controlling each constituent element in each unit pixel 50. Thus, it is possible to obtain the same advantages as in the solid-state imaging device 1 of the first embodiment.

In the solid-state imaging device according to the second embodiment, the pulse generation unit 255 disposed in the second substrate generates the control signals (pulse signals) for simultaneously controlling the transistors disposed in the pixel unit 11 of the first substrate in the unit pixels 50. Thus, in the vertical reading circuit 25 of the solid-state imaging device according to the second embodiment, it is possible to reduce the number of inter-substrate connectors 13 connecting the signals of the first substrate and the signals of the second substrate more than in the vertical reading circuit 20 of the solid-state imaging device 1 according to the first embodiment.

That is, in the vertical reading circuit 25 of the solid-state imaging device according to the second embodiment, one control signal (the global shutter signal FGS) is merely added to the number of control signals of the transistors disposed in the pixel unit 11 of the first substrate in the unit pixels 50. Therefore, it is possible to adapt to the exposure of the global shutter system. Thus, it is possible to obtain the great advantage of suppressing the deterioration in the yield ratio when the first and second substrates are connected.

Third Embodiment

Next, the solid-state imaging device mounted on the digital camera 7 will be described according to a third embodiment.

The solid-state imaging device according to the third embodiment has a different circuit configuration of the unit pixel 50 in the pixel array unit 40 from the solid-state imaging device 1 shown in FIG. 2 in the first embodiment. Since the configuration of the unit pixel is changed, the circuit configuration of the vertical reading circuit 20 in the solid-state imaging device 1 shown in FIG. 2 in the first embodiment is also different. More specifically, the unit pixel 50 of the solid-state imaging device 1 shown in FIG. 2 in the first embodiment is substituted with a unit pixel 52, and the vertical reading circuit 20 is substituted with a vertical reading circuit 26. The other constituent elements are the same as those of the solid-state imaging device 1 according to the first embodiment. Accordingly, the same reference numerals are given to the constituent elements of the solid-state imaging device of the third embodiment which are the same as the constituent elements of the solid-state imaging device 1 shown in FIG. 2 in the first embodiment, and the detailed description will not be repeated here.

Figure 7:
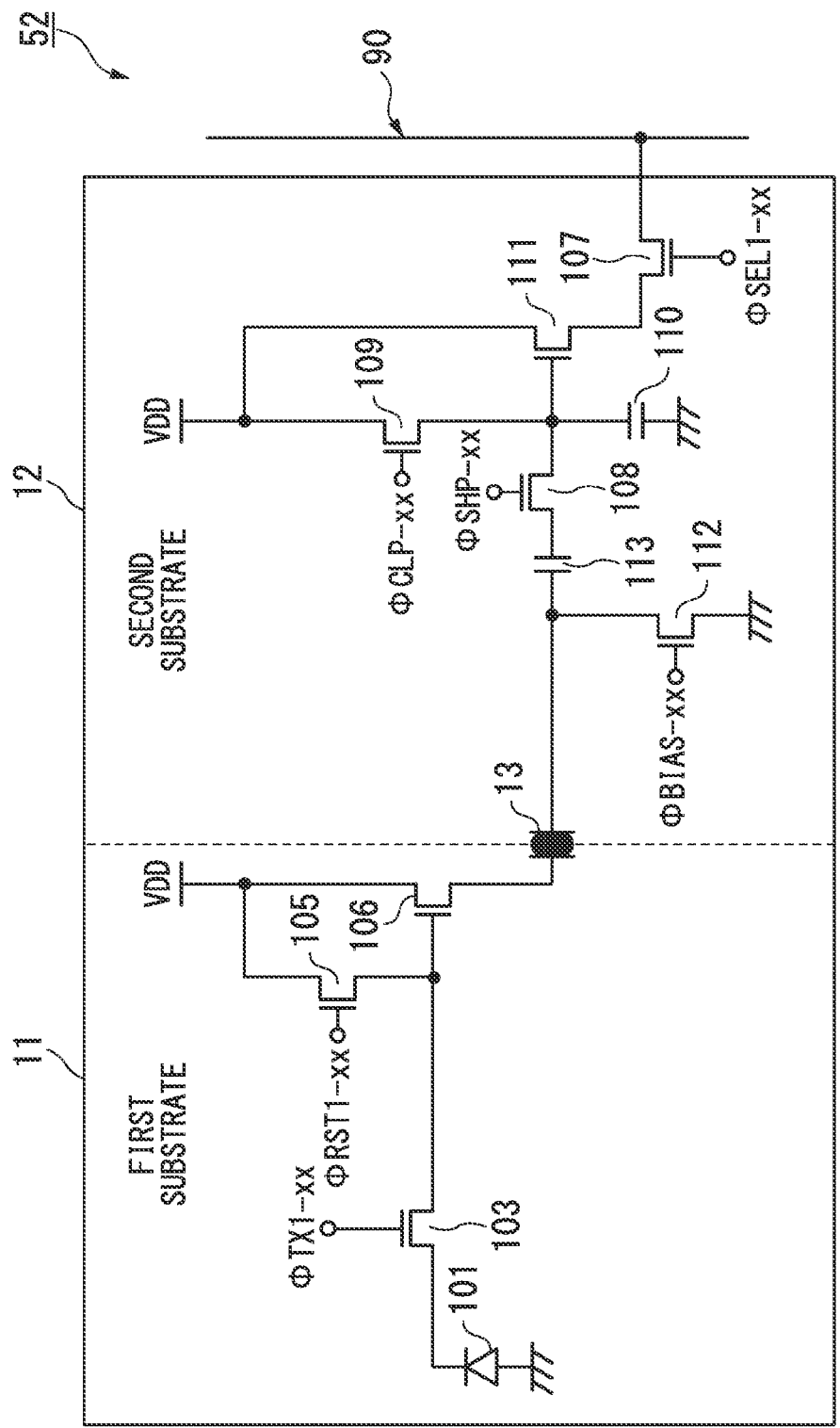
FIG. 7 is a circuit diagram illustrating a general configuration of a unit pixel in a pixel array unit of the solid-state imaging device according to a third embodiment of the present invention.

FIG. 7 is a circuit diagram illustrating a general configuration of the unit pixel 52 in the pixel array unit 40 of the solid-state imaging device according to the third embodiment. As in the unit pixel 50 shown in FIG. 3, the unit pixel 52 converts incident subject light into a pixel signal and outputs the pixel signal according to the incident subject light to the vertical signal line 90 according to the control signal input from the vertical reading circuit 26. In FIG. 7, one unit pixel 52 is shown. Even in the solid-state imaging device according to the third embodiment, as shown in FIG. 7, constituent elements of each unit pixel 52 are divided and disposed in the pixel unit 11 of the first substrate and the pixel unit 12 of the second substrate. In the following description, the same reference numerals are given to the constituent elements of the unit pixels 52 having the same functions as the constituent elements of the unit pixel 50 shown in FIG. 3.

In FIG. 7, the unit pixel 52 includes a photoelectric conversion element 101, a first transfer transistor 103, a pixel reset transistor 105, and a first amplification transistor 106 formed in the pixel unit 11 of the first substrate and includes a selection transistor 107, an in-pixel sample and hold transistor 108, an in-pixel clamp transistor 109, a charge storage element 110, a second amplification transistor 111, a first pixel load transistor 112, and an in-pixel clamp capacitor 113 formed in the pixel unit 12 of the second substrate. The pixel unit 11 of the first substrate and the pixel unit 12 of the second substrate are connected via the inter-substrate connectors 13.

Since the inter-substrate connector 13 is a connector electrically connecting the first and second substrates, as in the inter-substrate connector 13 shown in FIG. 3, the detailed description will not be repeated here. In the unit pixel 52 shown in FIG. 7, the first amplification transistor 106 in the pixel unit 11 of the first substrate is connected to the first pixel load transistor 112 and the in-pixel clamp capacitor 113 in the pixel unit 12 of the second substrate via the inter-substrate connector 13.

The photoelectric conversion element 101 photoelectrically converts incident light to generate a signal charge and stores the signal charge as a photoelectric conversion signal.

The first transfer transistor 103 transfers the photoelectric conversion signal stored in the photoelectric conversion element 101 to the gate terminal of the first amplification transistor 106 according to a transfer pulse signal $\Phi TX1\text{-}xx$ input from the vertical reading circuit 26.

The first amplification transistor 106 outputs a signal voltage according to the photoelectric conversion signal transferred to the gate terminal.

In a signal name "transfer pulse signal $\Phi TX1\text{-}xx$" of the above-described control signal, the portion "xx" suffixed to the name "transfer pulse signal $\Phi TX1$" of the control signal with "-" indicates a row number of the unit pixel 52 arrayed in the pixel array unit 40, as in the unit pixel 50 shown in FIG. 3. Even in the third embodiment, a reference numeral of a row number of the unit pixel 52 arrayed in the pixel array unit 40 is described in the portion "xx" of each control signal, as in the first and second embodiments. When a reference numeral of a row number is not described in the portion "xx" and only "xx" is listed, a control signal in this description indicates a control signal considered to have an appropriate row number, as in the first and second embodiments.

The pixel reset transistor 105 resets a signal in the unit pixel 52 to a power supply voltage VDD according to a reset pulse signal $\Phi RST1\text{-}xx$ input from the vertical reading circuit 26.

The first pixel load transistor 112 functions as the load of the first amplification transistor 106 according to a bias signal $\Phi BIAS\text{-}xx$ input from the vertical reading circuit 26. The first pixel load transistor 112 supplies a current to the first amplification transistor 106 to drive the first amplification transistor 106.

The in-pixel clamp capacitor 113 is a capacitor that retains (stores) a signal voltage output from the first amplification transistor 106.

The in-pixel clamp transistor 109 clamps the charge storage element 110 and the in-pixel clamp capacitor 113 to a fixed potential according to a clamp pulse signal FCLP-xx input from the vertical reading circuit 26. Thus, the charge storage element 110 and the in-pixel clamp capacitor 113 hold the clamped fixed potential.

The in-pixel sample and hold transistor 108 holds a signal in the charge storage element 110 according to a sample and hold pulse signal FSHP-xx input from the vertical reading circuit 26.

The charge storage element 110 is a capacitor that retains (stores) a signal voltage (a signal from which noise is processed in the unit pixel 52) input via the in-pixel sample and hold transistor 108.

As the unit pixel 52 includes the first pixel load transistor 112, the in-pixel clamp transistor 109, the in-pixel sample and hold transistor 108, the charge storage element 110, and the in-pixel clamp capacitor 113, a process of removing noise caused by leakage or the like is performed in the unit pixel 52. The charge storage element 110 retains (stores) the signal subjected to the noise removing process. As the charge storage element 110, a metal insulator metal (MIM) capacitor or a metal oxide semiconductor (MOS) capacitor, which is a capacitor in which a leakage current (dark current) per unit area is small, is more preferably used. Thus, since resistance against noise is improved, a high-quality signal may be obtained.

The second amplification transistor 111 outputs a signal voltage of the gate terminal, that is, a signal voltage according to the signal subjected to the noise removing process and stored in the charge storage element 110.

The selection transistor 107 outputs the signal voltage output by the second amplification transistor 111 as a pixel signal output by the unit pixel 52 to the vertical signal line 90 according to a row selection pulse signal ΦSEL1-xx input from the vertical reading circuit 26.

As in the solid-state imaging device 1 according to the first embodiment shown in FIG. 2, the solid-state imaging device according to the third embodiment corresponds to the exposure of the rolling shutter system in which the unit pixels 52 arrayed in the pixel array unit 40 are sequentially exposed for each row and the exposure of the global shutter system in which all of the unit pixels 52 arrayed in the pixel array unit 40 are simultaneously exposed. Further, in the solid-state imaging device according to the third embodiment, the vertical reading circuit 26 controls the unit pixels 52 according to each exposure system.

More specifically, when the exposure of the rolling shutter system is performed, the vertical reading circuit 26 sequentially performs start of photoelectric conversion by the photoelectric conversion elements 101 of the unit pixels 52 and transfer of the photoelectric conversion signals stored by the photoelectric conversion elements 101 to the gate terminal of the first amplification transistor 106 by sequentially outputting the reset pulse signal ΦRST1-xx and the transfer pulse signal ΦTX1-xx for each row. Further, the vertical reading circuit 26 sequentially performs the photoelectric conversion signal amplifying process and the noise removing process by sequentially controlling the sample and hold pulse signal FSHP-xx, the clamp pulse signal FCLP-xx, the bias signal ΦBIAS-xx, and the reset pulse signal ΦRST1-xx of the unit pixel 52, and then sequentially holds the signal from which noise is removed in the charge storage element 110.

When the exposure of the global shutter system is performed, the vertical reading circuit 26 causes the photoelectric conversion elements 101 of all the unit pixels 52 to simultaneously start the photoelectric conversion by simultaneously outputting the reset pulse signals ΦRST1-xx and the transfer pulse signal ΦTX1-xx of all the unit pixels 52. Then, after an exposure time determined in advance passes, the vertical reading circuit 26 simultaneously outputs the transfer pulse signals ΦTX1-xx of all the unit pixels 52, and simultaneously transfers the photoelectric conversion signals stored by the photoelectric conversion elements 101 of all the unit pixels 52 to the gate terminals of the first amplification transistors 106. At this time, the vertical reading circuit 26 simultaneously performs the photoelectric conversion signal amplifying process and the noise removing process by simultaneously controlling the sample and hold pulse signal FSHP-xx, the clamp pulse signal FCLP-xx, the bias signal ΦBIAS-xx, and the reset pulse signal ΦRST1-xx of all the unit pixels 52, and then sequentially holds the signal from which noise is removed in the charge storage element 110.

Thereafter, as in the solid-state imaging device 1 shown in FIG. 2 in the first embodiment, in the solid-state imaging device according to the third embodiment, the vertical reading circuit 26 photoelectrically converts the unit pixels 52 by sequentially controlling the unit pixels 52 for each row and outputs the pixel signals from which noise is removed to the vertical signal lines 90.

More specifically, the vertical reading circuit 26 sequentially outputs (reads) the photoelectric conversion signals subjected to the noise removing process and respectively retained in the charge storage elements 110 as the pixel signals to the vertical signal lines 90 by controlling the clamp pulse signal FCLP-xx and the row selection pulse signal ΦSEL1-xx for each row of the unit pixels 52. Since each unit pixel 52 includes the charge storage element 110 and the charge storage element 110 holds the amplified signal from which noise is removed, the quality of a signal is prevented from deteriorating due to noise caused by leakage or the like occurring until the reading from each unit pixel 52 more than the unit pixels 50 shown in FIG. 3.

Figure 8:
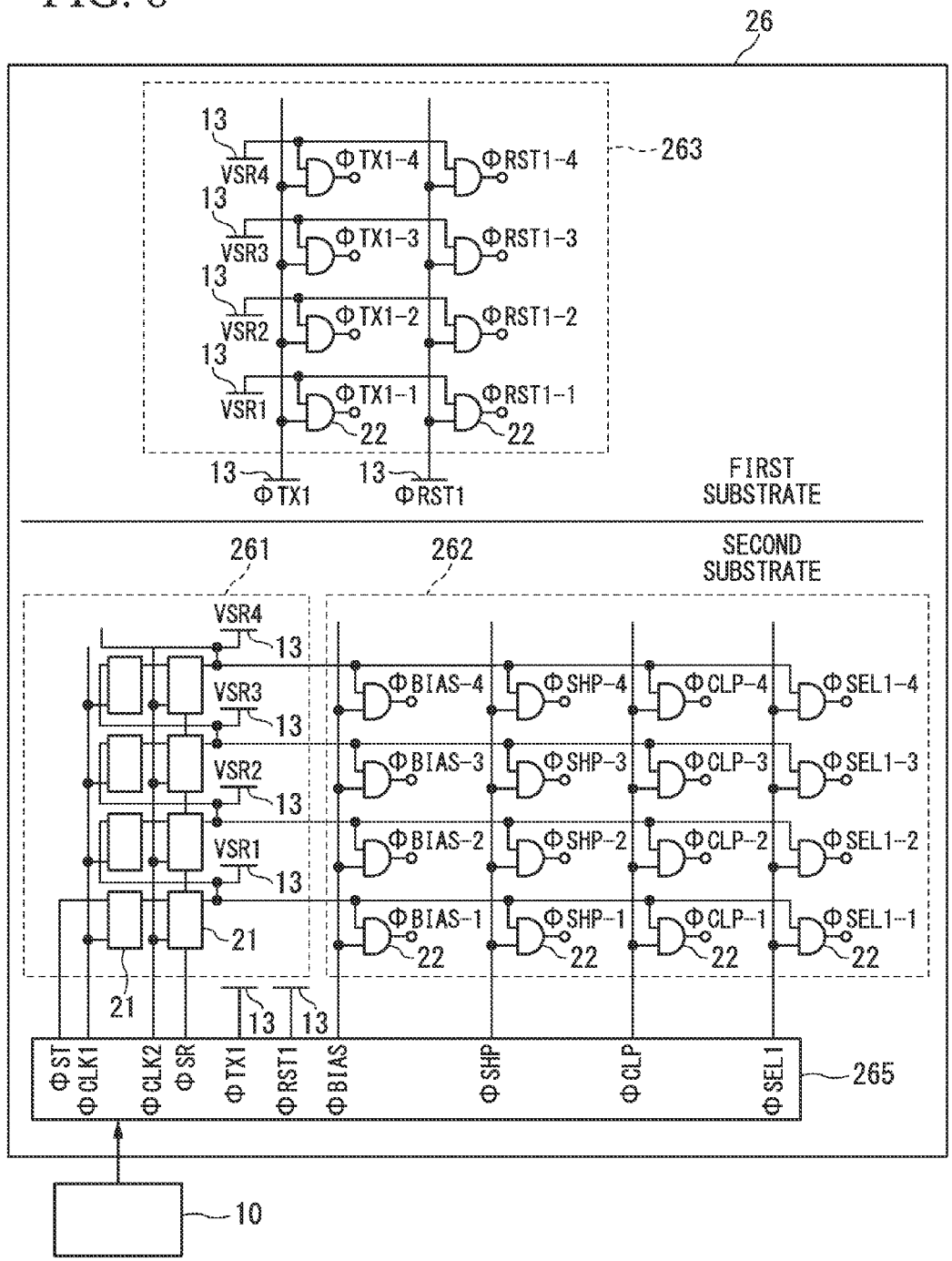
FIG. 8 is a circuit diagram illustrating a general configuration of a vertical reading circuit in a solid-state imaging device according to the third embodiment.

Next, the vertical reading circuit 26 in the solid-state imaging device according to the third embodiment will be described. FIG. 8 is a circuit diagram illustrating a general configuration of the vertical reading circuit 26 in the solid-state imaging device according to the third embodiment. As in the vertical reading circuit 20 shown in FIG. 4, the vertical reading circuit 26 outputs the control signals to the unit pixels 52 to control the unit pixels 52 arrayed in the pixel array unit 40 for each row and outputs the pixel signals of the unit pixels 52 of each row to the vertical signal lines 90 under the control of the solid-state imaging device control signal generation circuit 10. FIG. 8 shows an example of the vertical reading circuit 26 that controls the unit pixels 52 arrayed two-dimensionally in four rows and one column in the pixel array unit 40 for each row, as in the vertical reading circuit 20 shown in FIG. 4.

As seen in FIG. 8, the vertical reading circuit 26 is configured to generate the control signal (pulse signal) corresponding to each transistor of the unit pixel 52 shown in FIG. 7, but the basic configuration of the vertical reading circuit 26 is the same as the configuration of the vertical reading circuit 20 shown in FIG. 4.

The vertical reading circuit 26 includes: a vertical selection unit 261 that selects the unit pixels 52 of a specific row arrayed in the pixel array unit 40, a logical unit 262 that generates a control signal of each transistor formed in the pixel unit 12 of the second substrate in the unit pixels 52 of the row selected by the vertical selection unit 261, a logical unit 263 that generates a control signal of each transistor formed in the pixel unit 11 of the first substrate in the unit pixels 52 of the row selected by the vertical selection unit 261, and a pulse generation unit 265 that generates a control signal (pulse signal) for causing the vertical selection unit 261, the logical unit 262, and the logical unit 263 to control the unit pixels 52. The constituent elements in the vertical reading circuit 26 are divided and disposed in the first and second substrates, as in the vertical reading circuit 20 shown in FIG. 4.

More specifically, in the vertical reading circuit 26, the vertical selection unit 261, the logical unit 262, and the pulse generation unit 265 are disposed in the second substrate, and the logical unit 263 is disposed in the first substrate. Further, the logical unit 263 disposed in the first substrate is connected to the vertical selection unit 261 and the pulse generation unit 265 disposed in the second substrate via inter-substrate connectors 13, as in the vertical reading circuit 20 shown in FIG. 4. Accordingly, as in the vertical reading circuit 20 shown in FIG. 4, even in the vertical reading circuit 26, the vertical selection unit 261 and the pulse generation unit 265 are disposed only in the second substrate and a row selecting signal generated by the vertical selection unit 261 is output to the logical unit 263 disposed in the first substrate via the inter-substrate connectors 13. Further, some of the signals generated by the pulse generation unit 265 are output to the logical unit 263 disposed in the first substrate via the inter-substrate connectors 13.

Since the inter-substrate connector 13 is a connector that electrically connects the first and second substrates to each other, as in the inter-substrate connector 13 shown in FIGS. 3 to 7, the detailed description will not be repeated here. In the vertical reading circuit 26 shown in FIG. 8, row selecting signals VSR1 to VSR4 of the logical unit 263 of the first substrate are connected to the row selecting signals VSR1 to VSR4 of the vertical selection unit 261 of the second substrates via the inter-substrate connectors 13. Further, the transfer pulse signal ΦTX1 and the reset pulse signal ΦRST1 of the logical unit 263 of the first substrate are connected to the transfer pulse signal ΦTX1 and the reset pulse signal ΦRST1 of the pulse generation unit 265 of the second substrate via the inter-substrate connectors 13, respectively.

As in the pulse generation unit 205 of the vertical reading circuit 20 shown in FIG. 4, the pulse generation unit 265 generates control signals (a pixel selecting signal ΦST, clock signals ΦCLK1 and ΦCLK2, and a whole pixel selecting signal ΦSR) for selecting the unit pixels 52 arrayed in the pixel array unit 40 under the control of the solid-state imaging device control signal generation circuit 10. Further, the pulse generation unit 265 outputs the generated control signals for selecting the unit pixels 52 to the vertical selection unit 261.

The pulse generation unit 265 generates signals (the transfer pulse signal ΦTX1, the reset pulse signal ΦRST1, the bias signal ΦBIAS, the sample and hold pulse signal FSHP, the clamp pulse signal FCLP, and the row selection pulse signal ΦSEL1) for controlling the unit pixels 52 arrayed in the pixel array unit 40 as control signals under the control of the solid-state imaging device control signal generation circuit 10. Further, the pulse generation unit 265 outputs each of the generated control signals for controlling the unit pixels 52 to the logical unit 262 or 263.

As in the vertical selection unit 201 of the vertical reading circuit 20 shown in FIG. 4, the vertical selection unit 261 generates the row selecting signals VSR1 to VSR4 for selecting the unit pixels 52 arrayed in the pixel array unit 40 for each row based on the control signals for selecting the unit pixels 52 and input from the pulse generation unit 265. Further, the vertical selection unit 261 outputs the generated row selecting signals VSR1 to VSR4 to the logical units 262 and 263. As in the vertical selection unit 201 of the vertical reading circuit 20 shown in FIG. 4, the vertical selection unit 261 includes, for example, a shift register in which a plurality of flip-flops 21 are connected.

A method of generating the row selecting signals VSR1 to VSR4 in the vertical selection unit 261, that is a method of generating the row selecting signals VSR1 to VSR4 when the solid-state imaging device according to the third embodiment performs the exposure of the rolling shutter system or the exposure of the global shutter system is the same as the method of generating the row selecting signals VSR1 to VSR4 in the vertical selection unit 201 of the vertical reading circuit 20 shown in FIG. 4.

When the solid-state imaging device according to the third embodiment performs the exposure of the rolling shutter system, the vertical selection unit 261 generates the row selecting signals VSR1 to VSR4 for sequentially selecting the unit pixels 52 arrayed in the pixel array unit 40 for each row based on the pixel selecting signal ΦST and the clock signals ΦCLK1 and ΦCLK2 input from the pulse generation unit 265.

When the solid-state imaging device according to the third embodiment performs the exposure of the global shutter system, the vertical selection unit 261 generates the row selecting signals VSR1 to VSR4 for simultaneously selecting all of the unit pixels 52 arrayed in the pixel array unit 40 based on the whole pixel selecting signal ΦSR input from the pulse generation unit 265.

Based on the row selecting signals VSR1 to VSR4 input from the vertical selection unit 261, the logical unit 262 outputs the signals (the bias signal ΦBIAS, the sample and hold pulse signal FSHP, the clamp pulse signal FCLP, and the row selection pulse signal ΦSEL1) input from the pulse generation unit 265 to each transistor formed in the pixel unit 12 of the second substrate in the unit pixels 52, as in the logical unit 202 of the vertical reading circuit 20 shown in FIG. 4. The logical unit 262 includes, for example, logical elements such as a plurality of logic AND circuits (AND circuits) 22, as in the logical unit 202 of the vertical reading circuit 20 shown in FIG. 4.

More specifically, based on the row selecting signals VSR1 to VSR4, the logical unit 262 selects a row of the unit pixels 52 arrayed in the pixel array unit 40 to output the bias signal (BIAS, the sample and hold pulse signal FSHP, the clamp pulse signal FCLP, and the row selection pulse signal ΦSEL1. Then, the logical unit 262 generates the signals (bias signals ΦBIAS-1 to 4, sample and hold pulse signals FSHP-1 to 4, clamp pulse signals FCLP-1 to 4, and row selection pulse signals ΦSEL1-1 to 4) configured to operate each transistor in the unit pixels 52 of the selected row and not to operate each transistor in the unit pixels 52 of a non-selected row. Then, the logical unit 262 outputs the generated bias signals ΦBIAS-1 to 4, the generated sample and hold pulse signals FSHP-1 to 4, the generated clamp pulse signals FCLP-1 to 4, and the generated row selection pulse signals ΦSEL1-1 to 4 to each transistor formed in the pixel unit 12 of the second substrate in all the unit pixels 52 arrayed in the pixel array unit 40.

Thus, the bias signal ΦBIAS, the sample and hold pulse signal FSHP, the clamp pulse signal FCLP, and the row selection pulse signal ΦSEL1 input from the pulse generation unit 265 are output only to each transistor formed in the pixel unit 12 of the second substrate in the unit pixels 52 of the selected row.

Based on the row selecting signals VSR1 to VSR4 input from the vertical selection unit 261 via the inter-substrate connectors 13, the logical unit 263 outputs the pulse signals (the transfer pulse signal ΦTX1 and the reset pulse signal ΦRST1) input from the pulse generation unit 265 to each transistor formed in the pixel unit 11 of the first substrate in the unit pixels 52 via the inter-substrate connectors 13. The logical unit 263 includes, for example, logical elements such as a plurality of logic AND circuits (AND circuits) 22.

More specifically, based on the row selecting signals VSR1 to VSR4, the logical unit 263 selects a row of the unit pixels 52 arrayed in the pixel array unit 40 to output the transfer pulse signal ΦTX1 and the reset pulse signal ΦRST1. Then, the logical unit 263 generates the pulse signals (transfer pulse signals ΦTX1-1 to 4 and reset pulse signals ΦRST1-1 to 4) configured to operate each transistor in the unit pixels 52 of the selected row and configured not to operate each transistor in the unit pixels 52 of a non-selected row. Then, the logical unit 263 outputs the generated transfer pulse signals ΦTX1-1 to 4 and the generated reset pulse signals ΦRST1-1 to 4 to each transistor formed in the pixel unit 11 of the first substrate in all the unit pixels 52 arrayed in the pixel array unit 40.

Thus, the transfer pulse signal ΦTX1 and the reset pulse signal ΦRST1 input from the pulse generation unit 265 via the inter-substrate connectors 13 are output only to each transistor formed in the pixel unit 11 of the first substrate in the unit pixels 52 of the selected row.

In such a configuration, the solid-state imaging device according to the third embodiment performs the exposure of the rolling shutter system and the exposure of the global shutter system. When the solid-state imaging device according to the third embodiment performs the exposure of the rolling shutter system, the vertical reading circuit 26 sequentially controls the start of the photoelectric conversion performed by the photoelectric conversion elements 101 formed in the pixel unit 11 of the first substrate and the transfer of the photoelectric conversion signals stored by the photoelectric conversion elements 101 to the gate terminals of the first amplification transistors 106 for each row based on the reset pulse signals ΦRST1-1 to 4 and the transfer pulse signals ΦTX1-1 to 4. Further, the vertical reading circuit 26 performs the photoelectric conversion signal amplifying process and the noise removing process and sequentially holds the signals from which noise is removed in the charge storage elements 110 for each row by sequentially controlling the sample and hold pulse signals FSHP-1 to 4, the clamp pulse signals FCLP-1 to 4, the bias signals ΦBIAS-1 to 4, and the reset pulse signals ΦRST1-1 to 4.

When the solid-state imaging device according to the third embodiment performs the exposure of the global shutter system, the vertical reading circuit 26 simultaneously controls the start of the photoelectric conversion performed by all the photoelectric conversion elements 101 formed in the pixel unit 11 of the first substrate and the transfer of the photoelectric conversion signals stored by all the photoelectric conversion elements 101 to the gate terminals of the first amplification transistors 106 based on the reset pulse signals ΦRST1-1 to 4 and the transfer pulse signals ΦTX1-1 to 4. Further, the vertical reading circuit 26 performs the photoelectric conversion signal amplifying process and the noise removing process and simultaneously holds the signals from which noise is removed in the charge storage elements 110 by simultaneously controlling the sample and hold pulse signals FSHP-1 to 4, the clamp pulse signals FCLP-1 to 4, the bias signals ΦBIAS-1 to 4, and the reset pulse signals ΦRST1-1 to 4.

When the solid-state imaging device according to the third embodiment reads the photoelectric conversion signals held in the charge storage elements 110, the vertical reading circuit 26 sequentially outputs (reads) the pixel signals to the vertical signal lines 90 by controlling the clamp pulse signals ΦCLP-1 to 4 and the selection pulse signals ΦSEL1-1 to 4 for each row.

As described above, even in the solid-state imaging device according to the third embodiment, the constituent elements (the logical units 262 and 263) in the vertical reading circuit 26 are divided and disposed in the first and second substrates, as in the solid-state imaging device 1 according to the first embodiment. Further, one vertical selection unit 261 and the pulse generation unit 265 determine an output timing of the control signals (pulse signals) for controlling each constituent element in each unit pixel 52. Thus, it is possible to obtain the same advantages as in the solid-state imaging device 1 of the first embodiment.

Further, in the solid-state imaging device according to the third embodiment, it is possible to prevent a signal quality from deteriorating due to noise caused by light during a waiting period until the signal charges stored in the storage elements 110 are read, leakage of the storage capacitance, or the like in each unit pixel 52. Thus, in the solid-state imaging device according to the third embodiment, it is possible to obtain a high-quality image.

Fourth Embodiment

Next, a solid-state imaging device mounted on the digital camera 7 will be described according to a fourth embodiment.

The solid-state imaging device according to the fourth embodiment is a solid-state imaging device that corresponds only to exposure of the global shutter system. The solid-state imaging of the fourth embodiment has a circuit configuration different from the vertical reading circuit 26 of the solid-state imaging device of the third embodiment. The other constituent elements are the same as those of the solid-state imaging device according to the third embodiment. Accordingly, the same reference numerals are given to the constituent elements of the solid-state imaging device of the fourth embodiment which are the same as the constituent elements of the solid-state imaging device of the third embodiment, and the detailed description will not be repeated here.

Figure 9:
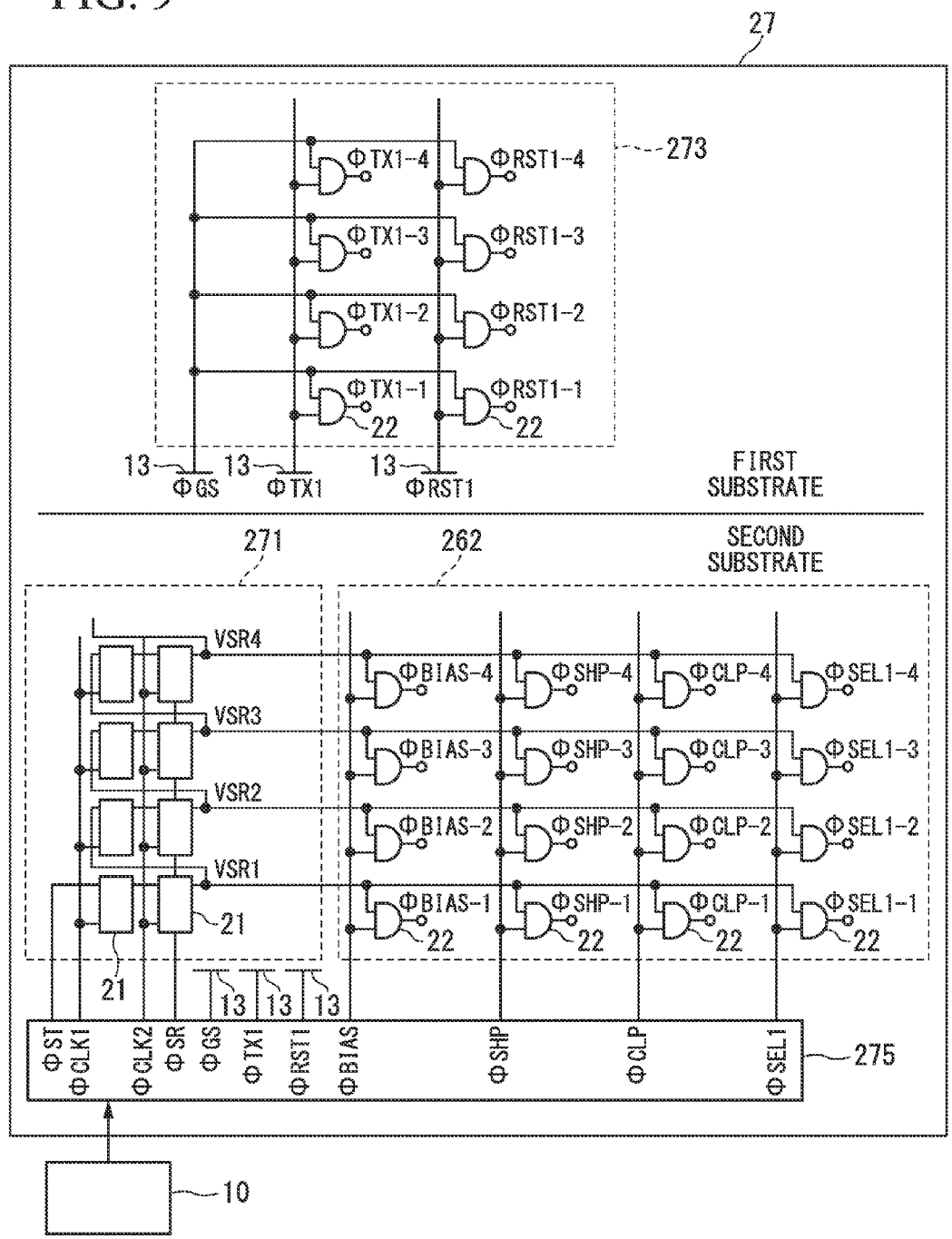
FIG. 9 is a circuit diagram illustrating a general configuration of a vertical reading circuit in a solid-state imaging device according to a fourth embodiment of the present invention.

FIG. 9 is a circuit diagram illustrating a general configuration of a vertical reading circuit 27 in the solid-state imaging device according to the fourth embodiment. As in the vertical reading circuit 26 shown in FIG. 8, the vertical reading circuit 27 outputs a control signal to each unit pixel 52 to control the unit pixels 52 arrayed in the pixel array unit 40 for each row and outputs the pixel signals of the unit pixels 52 of each row to the vertical signal lines 90 under the control of the solid-state imaging device control signal generation circuit 10. FIG. 9 shows an example of the vertical reading circuit 27 that controls the unit pixels 52 arrayed two-dimensionally in four rows and one column in the pixel array unit 40 for each row, as in the vertical reading circuit 26 shown in FIG. 8.

In FIG. 9, the vertical reading circuit 27 includes: a vertical selection unit 271 that selects the unit pixels 52 of a specific row arrayed in the pixel array unit 40, a logical unit 262 that generates a control signal of each transistor formed in the pixel unit 12 of the second substrate in the unit pixels 52 of the row selected by the vertical selection unit 271, a logical unit 273 that generates a control signal of each transistor formed in the pixel unit 11 of the first substrate in all the unit pixels 52, and a pulse generation unit 275 that generates a control signal (pulse signal) for causing the vertical selection unit 271, the logical unit 262, and the logical unit 273 to control the unit pixels 52.

In the vertical reading circuit 27, the constituent elements of the vertical reading circuit 27 are divided and disposed in the first and second substrates, as in the vertical reading circuit 26 shown in FIG. 8. That is, even in the vertical reading circuit 27, the vertical selection unit 271, the logical unit 262, and the pulse generation unit 275 are disposed in the second substrate, and the logical unit 273 is disposed in the first substrate. The logical unit 273 disposed in the first substrate is connected to the constituent elements of the vertical reading circuit 27 disposed in the second substrate via the inter-substrate connectors 13, as in the vertical reading circuit 26 shown in FIG. 8.

However, as in the solid-state imaging device according to the second embodiment, the solid-state imaging device according to the fourth embodiment is a solid-state imaging device that corresponds only to the exposure of the global shutter system. Accordingly, as in the solid-state imaging device according to the second embodiment, the logical unit 273 of the vertical reading circuit 27 disposed in the first substrate is connected only to the pulse generation unit 275 disposed in the second substrate by the inter-substrate connectors 13. That is, in the vertical reading circuit 27, as shown in FIG. 9, the row selecting signals VSR1 to VSR4 in the vertical reading circuit 26 shown in FIG. 8 are connected only to the logical unit 262 disposed in the first substrate. Instead of the row selecting signals VSR1 to VSR4, a global shutter signal ΦGS generated by the pulse generation unit 275 of the second substrate is connected to the logical unit 273 disposed in the first substrate.

As the above-described vertical reading circuit 26 is different from the vertical reading circuit 27, the vertical selection unit 271, the logical unit 273, and the pulse generation unit 275 of the vertical reading circuit 27 are different from the vertical selection unit 261, the logical unit 263, and the pulse generation unit 265 of the vertical reading circuit 26 shown in FIG. 8.

As in the pulse generation unit 265 of the vertical reading circuit 26 shown in FIG. 8, the pulse generation unit 275 generates control signals (a pixel selecting signal ΦST, clock signals ΦCLK1 and ΦCLK2, a whole pixel selecting signal ΦSR, and the global shutter signal ΦGS) for selecting the unit pixels 52 arrayed in the pixel array unit 40 under the control of the solid-state imaging device control signal generation circuit 10. Further, the pulse generation unit 275 outputs the generated control signals for selecting the unit pixels 52 to the vertical selection unit 271 or the logical unit 273.

As in the pulse generation unit 265 of the vertical reading circuit 26 shown in FIG. 8, the pulse generation unit 275 generates signals (a transfer pulse signal ΦTX1, a reset pulse signal ΦRST1, a bias signal ΦBIAS, a sample and hold signal ΦSHP, a clamp pulse signal ΦCLP, and a row selection pulse signal ΦSEL1) for controlling the unit pixels 52 arrayed in the pixel array unit 40 as control signals under the control of the solid-state imaging device control signal generation circuit 10. Further, the pulse generation unit 275 outputs each of the generated control signals for controlling the unit pixels 52 to the logical unit 262 or 273. Since the pulse signals generated by the pulse generation unit 275 and used to control the unit pixels 52 are the same as the pulse signals generated and output by the pulse generation unit 265 of the vertical reading circuit 26 shown in FIG. 8, the detailed description will not be repeated here.

The vertical selection unit 271 generates the row selecting signals VSR1 to VSR4 for selecting the unit pixels 52 arrayed in the pixel array unit 40 for each row, based on the control signals (the pixel selecting signal (PST and the clock signals ΦCLK1 and ΦCLK2) input from the pulse generation unit 275, as in the vertical selection unit 261 of the vertical reading circuit 26 shown in FIG. 8. However, the vertical selection unit 271 outputs the generated row selecting signals VSR1 to VSR4 only to the logical unit 262 and outputs each pulse signal generated by the pulse generation unit 275 to each transistor formed in the pixel unit 12 of the second substrate in the unit pixels 52 via the logical unit 262. Further, as in the vertical selection unit 261 of the vertical reading circuit 26 shown in FIG. 8, the vertical selection unit 271 includes, for example, a shift register in which a plurality of flip-flops 21 are connected.

The vertical selection unit 271 may also generate the row selecting signals VSR1 to VSR4 for simultaneously selecting all of the rows of the pixel unit 12 of the second substrate based on the whole pixel selecting signal FSR input from the pulse generation unit 275. That is, the vertical selection unit 271 may simultaneously output each pulse signal generated by the pulse generation unit 275 to the transistors formed in the pixel unit 12 of the second substrate in the unit pixels 52 of all the rows via the logical unit 202. Since the operation of the vertical selection unit 271 is the same as the operation of the vertical selection unit 261 of the vertical reading circuit 26 shown in FIG. 8, the detailed description will not be repeated here.

Based on the row selecting signals VSR1 to VSR4 input from the vertical selection unit 271, the logical unit 262 outputs the pulse signals (the bias signal ΦBIAS, the sample and hold signal ΦSHP, the clamp pulse signal ΦCLP, and the row selection pulse signal ΦSEL1) input from the pulse generation unit 275 to each transistor formed in the pixel unit 12 of the second substrate in the unit pixels 52. Since the operation of the logical unit 262 is the same as the operation of the logical unit 262 of the vertical reading circuit 26 shown in FIG. 8 except that each pulse signal input from the pulse generation unit 275 is output, the detailed description will not be repeated here.

Based on the global shutter signal FGS input from the pulse generation unit 275 via the inter-substrate connectors 13, the logical unit 273 simultaneously outputs the pulse signals (the transfer pulse signal ΦTX1 and the reset pulse signal ΦRST1) input from the pulse generation unit 275 via the inter-substrate connectors 13 to each transistor formed in the pixel unit 11 of the first substrate in the unit pixels 52 of all the rows. The logical unit 273 includes, for example, logical elements such as a plurality of logic AND circuits (AND circuits) 22.

More specifically, based on the global shutter signal FGS, the logical unit 273 selects all of the rows of the unit pixels 52 arrayed in the pixel array unit 40 to output the transfer pulse signal ΦTX1 and the reset pulse signal ΦRST1. Then, the logical unit 273 generates the pulse signals (transfer pulse signals ΦTX1-1 to 4 and reset pulse signals ΦRST1-1 to 4) configured to operate each transistor in the unit pixels 52 of all the rows. Then, the logical unit 273 simultaneously outputs the generated transfer pulse signals ΦTX1-1 to 4 and the generated reset pulse signals ΦRST1-1 to 4 to each transistor formed in the pixel unit 11 of the first substrate in all the unit pixels 52 arrayed in the pixel array unit 40.

Thus, the transfer pulse signal ΦTX1 and the reset pulse signal ΦRST1 input from the pulse generation unit 275 via the inter-substrate connectors 13 are simultaneously output to each transistor formed in the pixel unit 11 of the first substrate in the unit pixels 52 of all the rows.

In such a configuration, when the solid-state imaging device according to the fourth embodiment performs the exposure of the global shutter system, the vertical reading circuit 27 simultaneously outputs the reset pulse signals ΦRST1-1 to 4 and the transfer pulse signals ΦTX1-1 to 4 to all of the unit pixels 52. Thus, the vertical reading circuit 27 simultaneously controls the start of the photoelectric conversion by all the photoelectric conversion elements 101 formed in the pixel unit 11 of the first substrate and the transfer of the photoelectric conversion signals stored by all of the photoelectric conversion elements 101 to the gate terminals of the first amplification transistors 106.

The vertical reading circuit 26 performs the photoelectric conversion signal amplifying process and the noise removing process and simultaneously holds the signals from which noise is removed in the charge storage elements 110 formed in the pixel unit 12 of the second substrate by simultaneously controlling the sample and hold pulse signals FSHD-1 to 4, the clamp pulse signals FCLP-1 to 4, the bias signals ΦBIAS-1 to 4, and the reset pulse signals ΦRST1-1 to 4.

When the solid-state imaging device according to the fourth embodiment reads the photoelectric conversion signals retained in the charge storage elements 110, the vertical reading circuit 27 sequentially outputs (reads) the pixel signals to the vertical signal lines 90 by controlling the clamp pulse signals ΦCLP-1 to 4 and the row selection pulse signals ΦSEL1-1 to 4 for each row.

As described above, in the solid-state imaging device according to the fourth embodiment, the constituent elements (the logical units 262 and 273) in the vertical reading circuit 27 are divided and disposed in the first and second substrates, as in the solid-state imaging device 1 of the first embodiment, the solid-state imaging device of the second embodiment, and the solid-state imaging device of the third embodiment. Further, one vertical selection unit 271 and the pulse generation unit 275 determine an output timing of the control signals (pulse signals) for controlling each constituent element in each unit pixel 52. Thus, it is possible to obtain the same advantages as in the solid-state imaging device of the first to third embodiments.

Even in the solid-state imaging device according to the fourth embodiment, the pulse generation unit 275 disposed in the second substrate generates the control signals (pulse signals) for simultaneously controlling the transistors disposed in the pixel unit 11 of the first substrate in the unit pixels 52, as in the solid-state imaging device according to the second embodiment. Thus, even in the vertical reading circuit 27 of the solid-state imaging device according to the fourth embodiment, it is possible to reduce the number of inter-substrate connectors 13 connecting the signals of the first substrate and the signals of the second substrate more than in the vertical reading circuit 26 of the solid-state imaging device according to the third embodiment, as in the vertical reading circuit 25 of the solid-state imaging device according to the second embodiment. Further, since one control signal (the global shutter signal FGS) is merely added to the number of control signals of the transistors disposed in the pixel unit 11 of the first substrate in the unit pixels 52, it is possible to adapt to the exposure of the global shutter system. Thus, it is possible to obtain the great advantage of suppressing the deterioration in the yield ratio when the first and second substrates are connected.

Even in the solid-state imaging device according to the fourth embodiment, it is possible to prevent a signal quality from deteriorating due to noise caused by light during a waiting period until the signal charges stored in the storage elements 110 are read, leakage of the storage capacitance, or the like in the unit pixels 52, as in the solid-state imaging device according to the third embodiment. Thus, in the solid-state imaging device according to the third embodiment, it is possible to obtain a high-quality image.

According to the embodiments of the present invention, as described above, the unit pixels in the pixel array unit and the vertical reading circuit of the solid-state imaging device are divided and disposed in the first and second substrates. At this time, the vertical reading circuit is disposed so that one vertical selection unit and one pulse generation unit determine an output timing of the control signals (pulse signals) for controlling each constituent element in each unit pixel. Thus, as in a case in which a vertical reading circuit is formed in each substrate in a solid-state imaging device according to the related art, the vertical reading circuit may be configured without an increase in a circuit size of the solid-state imaging device. Thus, in this configuration, each constituent element in each unit pixel may be controlled without occurrence of timing deviation in the control signals (pulse signals) for controlling the transistors of the unit pixels divided and formed in the pixel unit of the first substrate and the pixel unit of the second substrate.

According to the embodiments of the present invention, the control signals (pulse signals) output to each transistor formed in the pixel unit of the first substrate are generated by the logical unit disposed in the first substrate, and the control signals (pulse signals) output to each transistor formed in the pixel unit 12 of the second substrate are generated by the logical unit disposed in the second substrate. Thus, in the solid-state imaging device in which the unit pixels are divided and formed in the pixel unit of the first substrate and the pixel unit of the second substrate, the number of inter-substrate connectors connecting the signals of the first substrate and the signals of the second substrate may be reduced, compared to a case in which all of the control signals (pulse signals) output to each transistor of the unit pixels are generated in one of the substrates. Thus, it is possible to expect the great advantage of suppressing the deterioration in the yield ratio when the first and second substrates are connected.

According to the embodiments of the present invention, only the control signals (pulse signals) generated by the pulse generation unit disposed in the second substrate are connected to the logical unit disposed in the first substrate when only the global shutter system is used as the exposure system to which the solid-state imaging device corresponds. That is, since the row selecting signal generated by the logical unit disposed in the second substrate and for selecting each transistor formed in the pixel unit of the first substrate for each row may not be connected to the logical unit disposed in the first substrate, it is possible to control each transistor formed in the pixel unit of the first substrate using only one control signal generated by the pulse generation unit disposed in the second substrate. Thus, since the number of inter-substrate connectors connecting the signals of the first substrate and the signal of the second substrate may be further reduced, it is possible to suppress the deterioration in the yield ratio when the first and second substrates are connected.

In the solid-state imaging device in which the unit pixels are divided and formed in the pixel unit of the first substrate and the pixel unit of the second substrate, separate manufacture of the first and second substrates included in the solid-state imaging device by semiconductor processing suitable for each of the first and second substrates may be considered. At this time, manufacture of the second substrate, in which only digital circuits are formed, by minute processes and manufacture of the first substrate, in which analog elements are formed, by processes in which reliability is important although not minute may be considered. In the embodiments of the present invention, the constituent element of the vertical reading circuit disposed in the first substrate is only the logical unit. Therefore, even when the first substrate is manufactured by a process which is not minute, it is possible to suppress an increase in the circuit size of the first substrate or an increase in a chip area (mounting area) of the solid-state imaging device.

A solid-state imaging device according to an aspect of the present invention corresponds to, for example, the solid-state imaging device 1 according to the embodiment. An imaging device corresponds to, for example, the digital camera 7. The connector corresponds to, for example, the inter-substrate connector 13. A pixel according to an aspect of the present invention corresponds to, for example, the unit pixel 50 according to the embodiment. A photoelectric conversion element corresponds to, for example, the photoelectric conversion element 101. A reading circuit corresponds to, for example, the second transfer transistor 104 and the selection transistor 107.

A pixel unit according to an aspect of the present invention corresponds to, for example, the pixel array unit 40 according to the embodiment. A read control circuit corresponds to, for example, the vertical reading circuit 20. A pulse generation unit according to an aspect of the present invention corresponds to, for example, the pulse generation unit 205 according to the embodiment. A selection unit corresponds to, for example, the vertical selection unit 201. A logical unit corresponds to, for example, the logical units 202 and 203.

A first logical unit according to an aspect of the present invention corresponds to, for example, the logical unit 203 according to the embodiment. A second logical unit corresponds to, for example, the logical unit 202.

A driving circuit in the first logical unit according to an aspect of the present invention corresponds to, for example, a logical AND circuit (AND circuit) according to the embodiment. A driving circuit in the second logical unit corresponds to, for example, a logical AND circuit (AND circuit) according to the embodiment.

A photoelectric conversion element reset unit according to an aspect of the present invention corresponds to, for example, the photoelectric conversion element reset transistor 102 according to the embodiment. A first transfer unit corresponds to, for example, the first transfer transistor 103. A storage unit according to an aspect of the present invention corresponds to, for example, the charge storage element 110 according to the embodiment. The amplification unit corresponds to, for example, the first amplification transistor 106. A second transfer unit according to an aspect of the present invention corresponds to, for example, the second transfer transistor 104 according to the embodiment. The reset unit corresponds to, for example, the pixel reset transistor 105. An output unit corresponds to, for example, the selection transistor 107. A load unit according to an aspect of the present invention corresponds to, for example, the first pixel load transistor 112 according to the embodiment. A sample holding unit corresponds to, for example, the in-pixel sample and hold transistor 108. A clamp unit corresponds to, for example, the in-pixel clamp transistor 109.

A reading transistor according to an aspect of the present invention corresponds to, for example, the second transfer transistor 104 and the selection transistor 107 according to the embodiment. A photoelectric conversion element reset transistor according to an aspect of the present invention corresponds to, for example, the photoelectric conversion element reset transistor 102 according to the embodiment. A first transfer transistor corresponds to, for example, the first transfer transistor 103. A storage capacitor and an analog memory circuit according to an aspect of the present invention correspond to, for example, the charge storage element 110 according to the embodiment. An amplification transistor corresponds to, for example, the first amplification transistor 106. A second transfer transistor according to an aspect of the present invention corresponds to, for example, the second transfer transistor 104 according to the embodiment. A reset transistor corresponds to, for example, the pixel reset transistor 105. An output transistor corresponds to, for example, the selection transistor 107. A load transistor according to an aspect of the present invention corresponds to, for example, the first pixel load transistor 112 according to the embodiment. The sample and hold transistor corresponds to, for example, the in-pixel sample and hold transistor 108. The clamp transistor corresponds to, for example, the in-pixel clamp transistor 109.

A specific configuration of the present invention is not limited to the embodiments of the present invention, but may be modified in various ways within the scope of the present invention without departing from the gist of the present invention. For example, in the embodiments of the present invention, the solid-state imaging device in which the exposure of the unit pixels 50 (or the unit pixels 52) arrayed in the pixel array unit 40 is controlled for each row and the output signals according to the pixel signals output from the unit pixels 50 (or the unit pixels 52) of each row to the vertical signal lines 90 are read sequentially to the horizontal signal line 70 has been described. However, for example, the concept of the present invention may be applied even to a solid-state imaging device (schematically, a solid-state imaging device rotated from the solid-state imaging device 1 shown in FIG. 2 by 90 degrees) in which the rows in the embodiments of the present invention are substituted with columns, the exposure of the unit pixels arrayed in the pixel array unit is controlled for each column and the output signals according to the pixel signals output from the unit pixels of each row are sequentially read.

For example, in the embodiments of the present invention, the case in which the vertical reading circuit 20 outputs the control signals for controlling the unit pixels 50 (or the unit pixels 52) arrayed in the pixel array unit 40 has been described. However, for example, the concept of the present invention is useful even when the vertical selection unit or the logical unit in the vertical reading circuit is configured to have more functions.

The specific configurations of the circuit configuration and the driving method according to the present invention are not limited to the embodiments of the present invention, but may be modified in various ways within the scope of the present invention without departing from the gist of the present invention. For example, even when the constituent elements or the circuit configuration in the solid-state imaging device, the unit pixel, or the vertical reading circuit are changed by changing the constituent elements of the pixels or the driving method, the constituent elements may be appropriately divided and disposed in the first and second substrates by applying the concept of the present invention according to the changed driving method or the changed control method.

The disposition of the pixels in the row direction and the column direction are not limited to the embodiments of the present invention. The number of pixels disposed in the row direction and the column direction may be modified within the scope of the present invention without departing from the gist of the present invention.

The embodiments of the present invention have been described, but any combination of the constituent elements and the processes and conversion from the expression of the present invention to a computer program product or the like are useful as aspects of the present invention. Here, the computer program product refers to a recording medium, a device, an apparatus, or a system in which program codes are recorded, such as a recording medium (a DVD medium, a hard disk medium, a memory medium, or the like) in which the program codes are recorded, a computer in which the program codes are recorded, and an internet system (for example, a system including a server and a client terminal) in which the program codes are recorded. In this case, each of the above constituent elements or each of the processes is mounted as a module and program codes formed from the mounted module are recorded in a computer program product.

For example, the computer program product according to an aspect of the present invention is a computer program product in which program codes are recorded to cause a computer to execute the processes of the solid-state imaging device in which the first and second substrates are electrically connected to each other by the connectors configured to electrically connect the first and second substrates to each other. Further, the computer program product is a computer program product in which program codes are recorded which include: a reading module configured such that the signals generated by the photoelectric conversion elements disposed in the first substrate and transmitted via the connectors are read by the reading circuit disposed in the second substrate, and a signal processing module performing signal processing on a signal read by the reading module by a signal processing circuit configured such that some of the elements or circuits are disposed in the first substrate, the remaining elements or circuits are disposed in the second substrate, and the elements or circuits disposed in the first substrate are connected to the elements or circuits disposed in the second substrate via the connectors.

For example, the above-described various processes relevant to the digital camera 7 may be performed by recording a program configured to realize the process of each constituent element of the digital camera 7 shown in FIG. 1 in a computer-readable recording medium and reading the program recorded in the recording medium to a computer system to execute the program. The "computer system" mentioned here may include an OS or hardware such as a peripheral device. Further, the "computer system" is assumed to include a homepage-providing environment (or a display environment), when the WWW system is used. The "computer-readable recording medium" refers to a storage device such as a non-volatile memory, on which data may be written, such as a flexible disk, a magneto-optical disc, a ROM, or a flash memory, a portable medium such as a CD-ROM, or a hard disk included in a computer system.

Further, the "computer-readable recording medium" is assumed to include a medium which retains a program for a given time, such as a volatile memory (for example, a dynamic random access memory (DRAM)) included in a computer system configured by a server or a client when a program is transmitted via a network such as the Internet or a communication line such as a telephone line. The program may be transmitted from a computer system storing the program in a storage device or the like to another computer system via a transmission medium or by transmission waves in a transmission medium. Here, the "transmission medium" transmitting the program refers to a medium that has a function of transmitting information, such as a network (communication network) such as the Internet or a communication link (communication line) such as a telephone link. The above-described program may be a program configured to realize some of the above-described functions. Further, the program may be a so-called difference file (difference program) in which the above-described functions are realized by combination with a program already recorded in a computer system.

The embodiments of the present invention have been described with reference to the drawings, but specific configurations are not limited to the embodiments. Various modifications are also included within the scope of the present invention without departing from the gist of the present invention.

According to an aspect of the present invention, there is provided a solid-state imaging device in which first and second substrates are electrically connected to each other via means. The device includes: a pixel means in which a plurality of pixels are arrayed two-dimensionally, each pixel including a photoelectric conversion means that is disposed in the first substrate and generates a signal according to an amount of incident light and a reading means that is disposed in the second substrate to correspond to the photoelectric conversion means and reads the signal generated by the corresponding photoelectric conversion means, and a read control means that controls the reading of the signal from the pixel. The read control means includes a pulse generation means that generates a control signal for controlling the reading of the signal from the pixel, a selection means that selects at least a row of the pixels arrayed in the pixel means of the second substrate based on the control signal, and a logical means that generates a driving signal for driving each means element in the pixels of the selected row based on the control signal and supplies the generated driving signal to each means element of each of the pixels arrayed in the pixel means. Among the constituent elements included in the read control means, some of the constituent elements are disposed in the first substrate and the remaining constituent elements of the read control means are disposed in the second substrate, and the constituent elements of the read control means disposed in the first substrate are electrically connected to the constituent elements of the read control means disposed in the second substrate via the connection means.

According to another aspect of the present invention, there is provided an imaging device including a solid-state imaging device in which first and second substrates are electrically connected to each other via connection means and which includes a pixel means, in which a plurality of pixels are arrayed two-dimensionally, each pixel including a photoelectric conversion means that is disposed in the first substrate and generates a signal according to an amount of incident light and a reading means that is disposed in the second substrate to correspond to the photoelectric conversion means and reads the signal generated by the corresponding photoelectric conversion means, and a read control means that controls the reading of the signal from the pixel. The read control means includes a pulse generation means that generates a control signal for controlling the reading of the signal from the pixel, a selection means that selects at least a row of the pixels arrayed in the pixel means of the second substrate based on the control signal, and a logical means that generates a driving signal for driving each means element in the pixels of the selected row based on the control signal and supplies the generated driving signal to each means element of each of the pixels arrayed in the pixel means. Among the constituent elements included in the read control means, some of the constituent elements are disposed in the first substrate and the remaining constituent elements of the read control means are disposed in the second substrate, and the constituent elements of the read control means disposed in the first substrate are electrically connected to the constituent elements of the read control means disposed in the second substrate via the connection means.

According to still another aspect of the present invention, there is provided a solid-state imaging device in which first and second substrates are electrically connected to each other via connection means. The device includes: a pixel means in which a plurality of pixels are arrayed two-dimensionally, each pixel including a photoelectric conversion means that is disposed in the first substrate and generates a signal according to an amount of incident light and a reading transistor which is disposed in the second substrate to correspond to the photoelectric conversion means and of which one of a source and a drain receives the signal generated by the corresponding photoelectric conversion means and the other of the source and the drain outputs the signal generated by the photoelectric conversion means, and a read control means that controls the reading of the signal from the pixel. The read control means includes a pulse generation means that generates a control signal for controlling the reading of the signal from the pixel, a selection means that selects at least a row of the pixels arrayed in the pixel means of the second substrate based on the control signal, and a logical means that generates a driving signal for driving each means element in the pixels of the selected row based on the control signal and supplies the generated driving signal to each means element of each of the pixels arrayed in the pixel means. Among the constituent elements included in the read control means, some of the constituent elements are disposed in the first substrate and the remaining constituent elements of the read control means are disposed in the second substrate, and the constituent elements of the read control means disposed in the first substrate are electrically connected to the constituent elements of the read control means disposed in the second substrate via the connection means.

According to another aspect of the present invention, there is provided an imaging device including a solid-state imaging device in which first and second substrates are electrically connected to each other via connection means and which includes a pixel means, in which a plurality of pixels are arrayed two-dimensionally, each pixel including a photoelectric conversion means that is disposed in the first substrate and generates a signal according to an amount of incident light and a reading transistor which is disposed in the second substrate to correspond to the photoelectric conversion means and of which one of a source and a drain receives the signal generated by the corresponding photoelectric conversion means and the other of the source and the drain outputs the signal generated by the corresponding photoelectric conversion means, and a read control means that controls the reading of the signal from the pixel. The read control means includes a pulse generation means that generates a control signal for controlling the reading of the signal from the pixel, a selection means that selects at least a row of the pixels arrayed in the pixel means of the second substrate based on the control signal, and a logical means that generates a driving signal for driving each means element in the pixels of the selected row based on the control signal and supplies the generated driving signal to each means element of each of the pixels arrayed in the pixel means. Among the constituent elements included in the read control means, some of the constituent elements are disposed in the first substrate and the remaining constituent elements of the read control means are disposed in the second substrate, and the constituent elements of the read control means disposed in the first substrate are electrically connected to the constituent elements of the read control means disposed in the second substrate via the connection means.

The embodiments of the present invention have been described with reference to the drawings, but specific configurations are not limited to the embodiments. Various substitutions, modifications, and equivalents are included within the scope of the present invention departing from the gist of the present invention. Accordingly, the scope of the present invention is not determined with reference to the above description, but is determined by the claims and all of the scopes of the equivalents are also included. The above-described characteristics may be combined with other characteristics, irrespective of whether the characteristics are preferable. In the claims, one or more of each constituent element may be included, unless explicitly stated otherwise. The claims should not be construed as inclusion of the limitation of a means-plus-function, excluding a case in which a phrase "means for" is explicitly written in the claims.

In the solid-state imaging device according to the embodiments of the present invention, two substrates may be connected to each other via the connectors, three or more substrates may be connected to the connectors. In a solid-state imaging device in which three or more substrates are connected to each other via the connectors, two of the substrates correspond to the first and second substrates of the claims.

What is claimed is:

1. A solid-state imaging device in which first and second substrates are electrically connected to each other via connectors, the solid-state imaging device comprising:
   a pixel unit in which a plurality of pixels are arrayed two-dimensionally, each pixel including a photoelectric conversion element that is disposed in the first substrate and generates a signal according to an amount of incident light and a reading circuit that is disposed in the second substrate to correspond to the photoelectric conversion element and reads the signal generated by the corresponding photoelectric conversion element; and
   a read control circuit that controls the reading of the signal from the pixel,
   wherein the read control circuit includes
      a pulse generation unit that generates a control signal for controlling the reading of the signal from the pixel,
      a selection unit that selects at least a row of the pixels arrayed in the pixel unit of the second substrate based on the control signal, and
      a logical unit that generates a driving signal for driving each circuit element in the pixels of the selected row based on the control signal and supplies the generated driving signal to each circuit element of each of the pixels arrayed in the pixel unit, and
   wherein, among constituent elements included in the read control circuit, some of the constituent elements are disposed in the first substrate and remaining constituent elements of the read control circuit are disposed in the second substrate, and the constituent elements of the read control circuit disposed in the first substrate are electrically connected to the constituent elements of the read control circuit disposed in the second substrate via the connectors.

2. The solid-state imaging device according to claim 1, wherein the pulse generation unit generates a control signal for sequentially reading the signals from the pixels for each row,
   wherein the selection unit sequentially selects the pixels disposed in the pixel unit of the first substrate and the pixel unit of the second substrate for each row, and
   wherein the logical unit generates the driving signal for driving each circuit element of the pixels of the sequentially selected rows for each row and supplies the generated driving signal to each circuit element of each of the pixels arrayed in the pixel unit of the first substrate and the pixel unit of the second substrate.

3. The solid-state imaging device according to claim 2, wherein the logical unit includes
   a first logical unit that includes a driving circuit driving each circuit element of each of the pixels arrayed in the pixel unit of the first substrate, and
   a second logical unit that includes a driving circuit driving each circuit element of each of the pixels arrayed in the pixel unit of the second substrate, and
   wherein the first logical unit is disposed in the first substrate and the second logical unit is disposed in the second substrate.

4. The solid-state imaging device according to claim 3, wherein the selection unit is disposed in the second substrate, and
   wherein the first logical unit and the selection unit are electrically connected to each other via the connector.

5. The solid-state imaging device according to claim 4, wherein the selection unit generates a selecting signal for selecting a row of the pixels arrayed in the pixel unit of the first substrate and supplies the generated selecting signal to the first logical unit via the connector.

6. The solid-state imaging device according to claim 5, wherein the first logical unit includes a plurality of the driving circuits respectively corresponding to the circuit elements of the pixels arrayed in the pixel unit of the first substrate, and
   wherein the selection unit generates a plurality of selecting signals respectively corresponding to the rows of the pixels arrayed in the pixel unit of the first substrate and supplies each generated selecting signal to each driving circuit in the first logical unit via each connector disposed to correspond to each row of the pixels arrayed in the pixel unit of the first substrate.

7. The solid-state imaging device according to claim 3, wherein the pulse generation unit is disposed in the second substrate, and wherein the first logical unit and the pulse generation unit are electrically connected to each other via the connector.

8. The solid-state imaging device according to claim 7, wherein the pulse generation unit generates a pulse signal which is a control signal for controlling each circuit element of the pixels arrayed in the pixel unit of the first substrate and supplies the generated pulse signal to the first logical unit via the connector.

9. The solid-state imaging device according to claim 8, wherein the first logical unit includes a plurality of driving circuits respectively corresponding to the circuit elements of the pixels arrayed in the pixel unit of the first substrate, and
wherein the pulse generation unit supplies the pulse signal for controlling each circuit element of the pixels arrayed in the pixel unit of the first substrate to each driving circuit in the first logical unit via each connector disposed to correspond to each circuit element of the pixels arrayed in the pixel unit of the first substrate.

10. The solid-state imaging device according to claim 2, wherein the pulse generation unit is disposed in the second substrate, and
wherein the constituent elements of the read control circuit disposed in the first substrate and the pulse generation unit are electrically connected to each other via the connectors.

11. The solid-state imaging device according to claim 2, wherein the selection unit is disposed in the second substrate, and
wherein the constituent elements of the read control circuit disposed in the first substrate and the selection unit are electrically connected to each other via the connectors.

12. The solid-state imaging device according to claim 3, wherein the pixels arrayed in the pixel unit of the first substrate each further include
a photoelectric conversion element reset unit that resets the signal generated by the photoelectric conversion element, and
a first transfer unit that transfers the signal generated by the photoelectric conversion element to the pixel unit of the second substrate via the connector,
wherein the pulse generation unit generates each control signal for controlling the photoelectric conversion element reset unit and the first transfer unit and supplies each generated control signal to the first logical unit, and
wherein the first logical unit generates each driving signal for driving the photoelectric conversion element reset unit and the first transfer unit based on each control signal, and supplies the generated driving signals to the photoelectric conversion element reset unit and the first transfer unit, respectively.

13. The solid-state imaging device according to claim 12, wherein the pixels arrayed in the pixel unit of the second substrate each further include
a storage unit that stores the signal generated by the photoelectric conversion element and transferred via the connector,
an amplification unit that amplifies the signal generated by the photoelectric conversion element,
a second transfer unit that transfers the signal stored in the storage unit to the amplification unit,
a reset unit that resets the signal transferred by the second transfer unit, and
an output unit that outputs the amplified signal amplified by the amplification unit as an output signal read from the pixel,
wherein the pulse generation unit generates each control signal for controlling the second transfer unit, the reset unit, and the output unit and supplies each generated control signal to the second logical unit, and
wherein the second logical unit generates each driving signal for driving the second transfer unit, the reset unit, and the output unit based on each control signal and supplies the generated driving signals to the second transfer unit, the reset unit, and the output unit, respectively.

14. The solid-state imaging device according to claim 3, wherein the pixels arrayed in the pixel unit of the first substrate each further include
an amplification unit that amplifies the signal generated by the photoelectric conversion element and outputs the amplified signal to the pixel unit of the second substrate via the connector,
a first transfer unit that transfers the signal generated by the photoelectric conversion element to the amplification unit, and
a reset unit that resets the signal transferred by the first transfer unit,
wherein the pulse generation unit generates each control signal for controlling the first transfer unit and the reset unit and supplies each generated control signal to the first logical unit, and
wherein the first logical unit generates each driving signal for driving the first transfer unit and the reset unit based on each control signal and supplies the generated driving signals to the first transfer unit and the reset unit, respectively.

15. The solid-state imaging device according to claim 14, wherein the pixels arrayed in the pixel unit of the second substrate each further include
a load unit which serves as load of the amplification unit,
a sample holding unit that samples and holds the amplified signal input via the connector,
a storage unit that stores the signal sampled and held by the sample holding unit,
a clamp unit that clamps the sampled and held signal stored by the storage unit to a fixed potential, and
an output unit that outputs the sampled and held signal stored by the storage unit as an output signal read from the pixel,
wherein the pulse generation unit generates each control signal for controlling the load unit, the sample holding unit, the clamp unit, and the output unit and supplies each generated control signal to the second logical unit, and
wherein the second logical unit generates each driving signal for driving the load unit, the sample holding unit, the clamp unit, and the output unit based on each control signal and supplies the generated driving signals to the load unit, the sample holding unit, the clamp unit, and the output unit, respectively.

16. The solid-state imaging device according to claim 2, wherein the pulse generation unit generates a control signal for sequentially selecting the pixels for each row, causing the photoelectric conversion elements of the pixels arrayed in the pixel unit of the first substrate to sequentially generate the signals according to the amount of incident light, and causing the reading circuit of the pixels arrayed in the pixel unit of the second substrate to sequentially read the signals generated by the corresponding photoelectric conversion elements, and supplies the generated control signal to the selection unit and the logical unit.

17. The solid-state imaging device according to claim 2, wherein the pulse generation unit generates a control signal for simultaneously selecting the pixels, causing the photoelectric conversion elements of the pixels arrayed in the pixel unit of the first substrate to simultaneously generate the signals according to the amount of incident light, sequentially selecting the pixels for each row, and causing the reading circuit of the pixels arrayed in the pixel unit of the second substrate to sequentially read the signals generated by the corresponding photoelectric conversion elements, and supplies the generated control signal to the selection unit and the logical unit.

18. The solid-state imaging device according to claim 1,
wherein the pulse generation unit generates a control signal for simultaneously reading the signals from all of the pixels arrayed in the pixel unit of the first substrate,
wherein the selection unit sequentially selects the pixels arrayed in the pixel unit of the second substrate for each row, and
wherein the logical unit generates a driving signal for simultaneously driving the circuit elements of all the pixels arrayed in the pixel unit of the first substrate and a driving signal for driving the circuit elements of the pixels of the sequentially selected rows for each row and supplies the generated driving signals to each circuit element of each of the pixels arrayed in the pixel unit of the first substrate and the pixel unit of the second substrate.

19. The solid-state imaging device according to claim 18, wherein the pulse generation unit generates a control signal for simultaneously selecting the pixels, causing the photoelectric conversion elements of the pixels arrayed in the pixel unit of the first substrate to simultaneously generate the signals according to the amount of incident light, sequentially selecting the pixels for each row, and causing the reading circuit of the pixels arrayed in the pixel unit of the second substrate to sequentially read the signals generated by the corresponding photoelectric conversion elements, and supplies the generated control signal to the selection unit and the logical unit.

20. The solid-state imaging device according to claim 1,
wherein the pixel further includes
a storage unit that stores the signal generated by the photoelectric conversion element, and
an amplification unit that amplifies the signal generated by the photoelectric conversion element,
wherein the photoelectric conversion elements of all the pixels are simultaneously reset,
wherein, after a predetermined time passes, the signals generated by the photoelectric conversion elements are simultaneously amplified by the amplification units of all the pixels,
wherein the amplified signals are simultaneously stored in the storage units of all the pixels, and
wherein the amplified signals stored in the storage units are output as output signals sequentially read by the reading circuits.

21. The solid-state imaging device according to claim 1, wherein a connection point of the connector on a side of the first substrate and a connection point of the connector on a side of the second substrate are disposed at one position on a path from an output terminal of the photoelectric conversion element to an input terminal of the reading circuit.

22. The solid-state imaging device according to claim 1, wherein the second substrate is connected to an opposite surface to the surface of the first substrate to which the light incident on the photoelectric conversion elements is radiated.

23. An imaging device comprising a solid-state imaging device in which first and second substrates are electrically connected to each other via connectors,
wherein the solid-state imaging device includes a pixel unit in which a plurality of pixels are arrayed two-dimensionally, each pixel including a photoelectric conversion element that is disposed in the first substrate and generates a signal according to an amount of incident light and a reading circuit that is disposed in the second substrate to correspond to the photoelectric conversion element and reads the signal generated by the corresponding photoelectric conversion element, and a read control circuit that controls the reading of the signal from the pixel,
wherein the read control circuit includes
a pulse generation unit that generates a control signal for controlling the reading of the signal from the pixel,
a selection unit that selects at least a row of the pixels arrayed in the pixel unit of the second substrate based on the control signal, and
a logical unit that generates a driving signal for driving each circuit element in the pixels of the selected row based on the control signal and supplies the generated driving signal to each circuit element of each of the pixels arrayed in the pixel unit, and
wherein, among constituent elements included in the read control circuit, some of the constituent elements are disposed in the first substrate and remaining constituent elements of the read control circuit are disposed in the second substrate, and the constituent elements of the read control circuit disposed in the first substrate are electrically connected to the constituent elements of the read control circuit disposed in the second substrate via the connectors.

24. A solid-state imaging device in which first and second substrates are electrically connected to each other via connectors, the solid-state imaging device comprising:
a pixel unit in which a plurality of pixels are arrayed two-dimensionally, each pixel including a photoelectric conversion element that is disposed in the first substrate and generates a signal according to an amount of incident light and a reading transistor which is disposed in the second substrate to correspond to the photoelectric conversion element and of which one of a source and a drain receives the signal generated by the corresponding photoelectric conversion element and the other of the source and the drain outputs the signal generated by the corresponding photoelectric conversion element; and
a read control circuit that controls the reading of the signal from the pixel,
wherein the read control circuit includes
a pulse generation unit that generates a control signal for controlling the reading of the signal from the pixel,
a selection unit that selects at least a row of the pixels arrayed in the pixel unit of the second substrate based on the control signal, and
a logical unit that generates a driving signal for driving each circuit element in the pixels of the selected row based on the control signal and supplies the generated driving signal to each circuit element of each of the pixels arrayed in the pixel unit, and
wherein, among the constituent elements included in the read control circuit, some of the constituent elements are disposed in the first substrate and the remaining constituent elements of the read control circuit are disposed in the second substrate, and the constituent elements of the read control circuit disposed in the first substrate are electrically connected to the constituent elements of the read control circuit disposed in the second substrate via the connectors.

25. The solid-state imaging device according to claim 24, wherein the pixel further includes
   an analog memory circuit which is a storage capacitor that stores the signal generated by the photoelectric conversion element, and
   an amplification transistor of which a gate receives the signal generated by the photoelectric conversion element and one of a source and a drain outputs an amplified signal,
wherein the photoelectric conversion elements of all the pixels are simultaneously reset,
wherein, after a predetermined time passes, the signals generated by the photoelectric conversion elements are simultaneously amplified by the amplification transistors of all the pixels,
wherein the amplified signals are simultaneously stored in the storage capacitors of all the pixels, and
wherein the amplified signals stored in the storage capacitors are output as output signals sequentially read by the reading transistors.

26. An imaging device comprising;
a solid-state imaging device in which first and second substrates are electrically connected to each other via connectors and which includes a pixel unit, in which a plurality of pixels are arrayed two-dimensionally, each pixel including a photoelectric conversion element that is disposed in the first substrate and generates a signal according to an amount of incident light and a reading transistor which is disposed in the second substrate to correspond to the photoelectric conversion element and of which one of a source and a drain receives the signal generated by the corresponding photoelectric conversion element and the other of the source and the drain outputs the signal generated by the corresponding photoelectric conversion element, and a read control circuit that controls the reading of the signal from the pixel,
wherein the read control circuit includes
   a pulse generation unit that generates a control signal for controlling the reading of the signal from the pixel,
   a selection unit that selects at least a row of the pixels arrayed in the pixel unit of the second substrate based on the control signal, and
   a logical unit that generates a driving signal for driving each circuit element in the pixels of the selected row based on the control signal and supplies the generated driving signal to each circuit element of each of the pixels arrayed in the pixel unit, and
wherein, among constituent elements included in the read control circuit, some of the constituent elements are disposed in the first substrate and remaining constituent elements of the read control circuit are disposed in the second substrate, and the constituent elements of the read control circuit disposed in the first substrate are electrically connected to the constituent elements of the read control circuit disposed in the second substrate via the connectors.

* * * * *